United States Patent
Ogawa et al.

(10) Patent No.: US 6,455,877 B1
(45) Date of Patent: Sep. 24, 2002

(54) III-N COMPOUND SEMICONDUCTOR DEVICE

(75) Inventors: Atsushi Ogawa; Takayuki Yuasa; Yoshihiro Ueta; Yuhzoh Tsuda; Masahiro Araki; Mototaka Taneya, all of Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/657,875

(22) Filed: Sep. 8, 2000

(30) Foreign Application Priority Data

Sep. 8, 1999 (JP) .......................... 11-253741
Sep. 4, 2000 (JP) ........................ 2000-266479
Sep. 4, 2000 (JP) ........................ 2000-266480

(51) Int. Cl.[7] ............................... H01L 33/00
(52) U.S. Cl. .................. 257/99; 257/101; 257/103; 257/627
(58) Field of Search .................. 257/99, 627, 628, 257/631, 101, 103

(56) References Cited

U.S. PATENT DOCUMENTS 5,432,808 A * 7/1995 Hatano et al. ................. 372/45
6,218,207 B1 * 4/2001 Itoh et al. ...................... 438/46

OTHER PUBLICATIONS

Seelmann–Eggebert, M. et al. (Nov. 3, 1997). "Polarity of (00.1) GaN epilayers grown on a (00.1) Sapphire," *Appl. Phys. Lett.* 71(18):2635–2637.
Smith, A.R. et al. (Apr. 27, 1998). "Determination of Wurtzite GaN Lattice Polarity Based on Surface Reconstruction," *Appl. Phys. Lett.* 72(17):2114–2116.

Nakamura, Shuji et al. (Aug. 10, 1998). "InGaN/GaN/AlGaN–based laser diodes with cleaved facets grown on GaN substrates," *Appl. Phys. Lett.* 73(6):832–834.
Masaru Kuramoto et al. (Feb. 15, 1999). "Room–Temperature Continuous–Wave Operation of InGaN Multi–Quantum–Well Laser Diodes Grown on an n–GaN Substrate with a Backside n–Contact," *Jpn. J. Appl Phys.* 38(1999):L184–L186.
Seelmann–Eggebert, M. et al. (Nov. 3, 1997) "Polarity of (00.1) GaN epilayers grown on a (00.1) sapphire," *Appl. Phys. Lett.* 71(18):2635–2637.
Smith, A. R. et al. (Apr. 27, 1998) "Determination of wurtzite GaN lattice polarity based on surface reconstruction," *Appl. Phys. Lett.* 72(17):2114–2116.

* cited by examiner

Primary Examiner—Sara Crane
(74) Attorney, Agent, or Firm—Morrison & Foerster LLP

(57) ABSTRACT

A GaN light-emitting device is provided having a low specific contact resistance of an n-type electrode as well as a low threshold voltage or threshold current density. The GaN light-emitting device has an electrode formed on a nitrogen-terminated surface of a GaN substrate. Specifically, the GaN light-emitting device includes the GaN substrate, a plurality of GaN compound semiconductor layers formed on the GaN substrate, and the n-type electrode and a p-type electrode, wherein the semiconductor substrate is of n-type and the n-type electrode is formed on the nitrogen-terminated surface of the semiconductor substrate. The concentration of n-type impurities in the substrate preferably ranges from $1 \times 10^{17}$ cm$^{-3}$ to $1 \times 10^{21}$ cm$^{-3}$. The substrate preferably includes at least a first portion forming the nitrogen-terminated surface and having a first concentration of n-type impurities and a second portion having a second concentration of n-type impurities lower than the first concentration of n-type impurities.

25 Claims, 29 Drawing Sheets

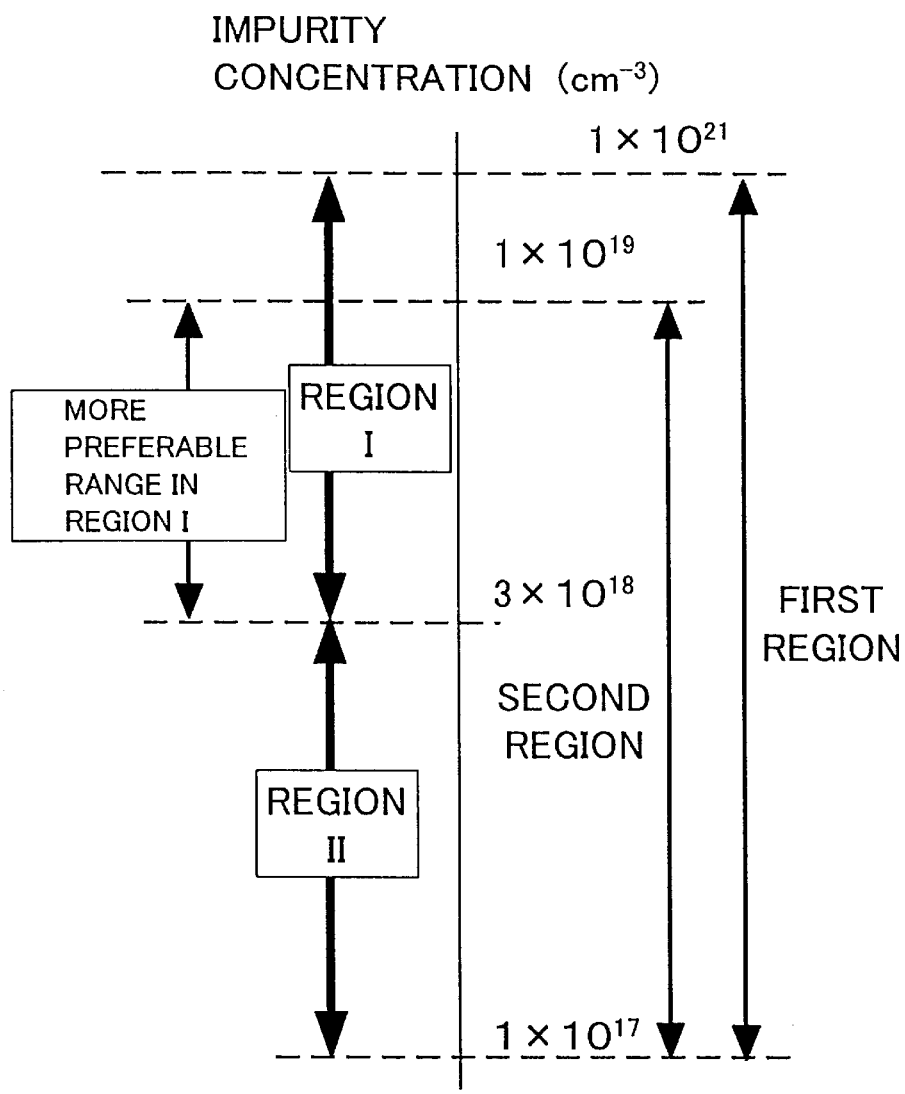

FIRST REGION:RANGE OF INPURITY CONCENTRATION DESCRIBED IN CONJUNCTION WITH EXAMPLES 1-6

SECOND REGION:RANGE OF IMPURITY CONCENTRATION MORE PREFERABLE THAN FIRST REGION

REGION I:RANGE OF IMPURITY CONCENTRATION IN REGION FOR FABRICATING N-TYPE ELECTRODE OF REGIONS WITH DIFFERENT IMPURITY CONCENTRATIONS DISCUSSED IN EXAMPLE 7

REGION II:RANGE OF IMPURITY CONCENTRATION IN REGION FOR FABRICATING LIGHT-EMITTING DEVICE STRUCTURE OF REGIONS WITH DIFFERENT IMPURITY CONCENTRATIONS DISCUSSED IN EXAMPLE 7

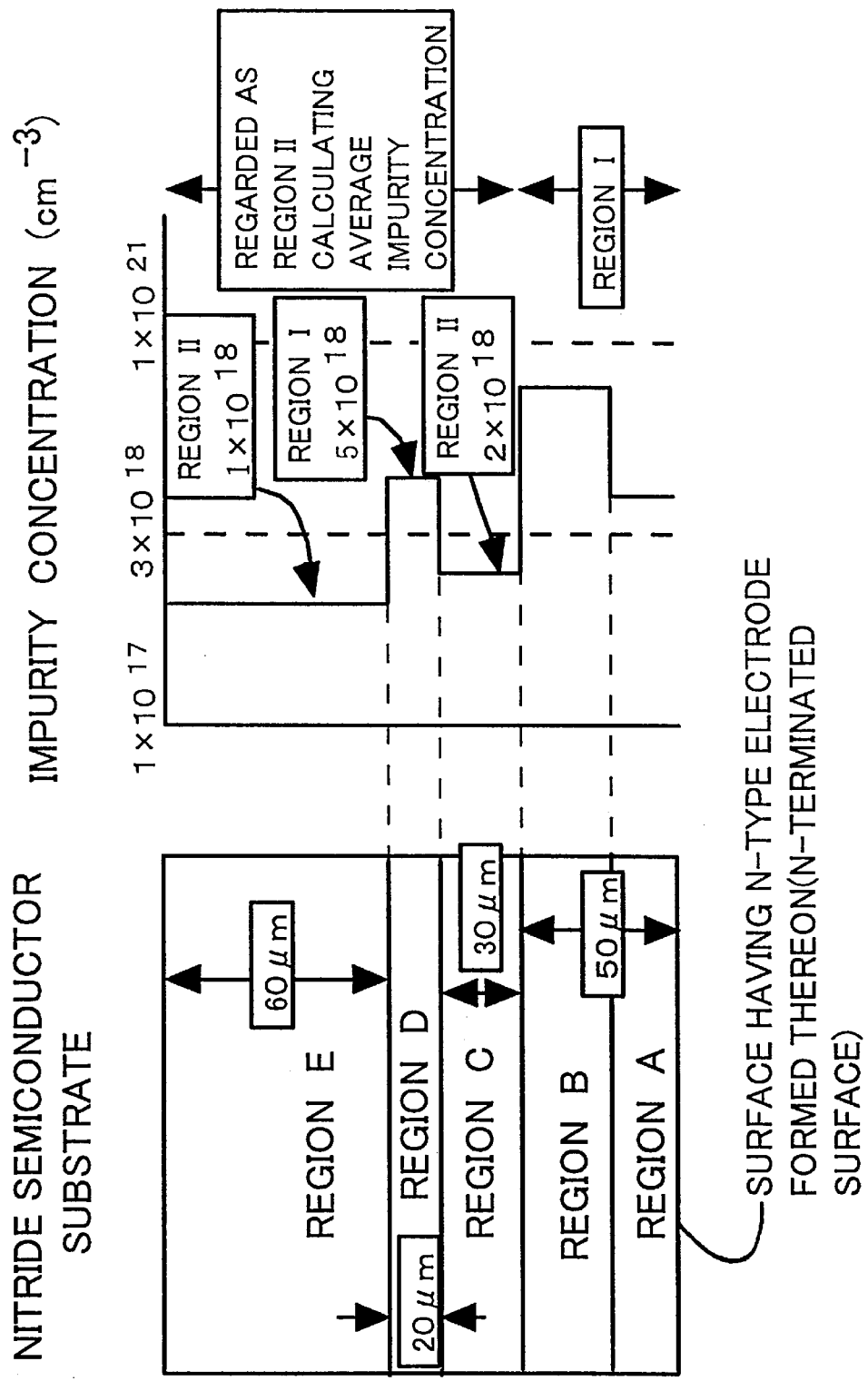

III-N COMPOUND SEMICONDUCTOR DEVICE

BACKGROUND OF THE INVENTION

1. Field of the Invention

The present invention relates to a semiconductor device and particularly to a light-emitting device fabricated on a III-N compound semiconductor substrate, specifically, a GaN compound semiconductor substrate.

2. Description of the Background Art

GaN compound semiconductors have been employed or studied for light-emitting devices and high-power devices due to their specific characteristics. For example, it is technically possible to produce and utilize light-emitting devices in a wide emitting light range of violet to reddish yellow by adjusting the composition thereof.

Recently, utilizing the characteristics of the GaN compound semiconductors, blue light-emitting diodes and green light-emitting diodes have been put into practical use, and blue violet semiconductor lasers have been developed.

In order to fabricate a GaN compound semiconductor film, a substrate is used which is formed of sapphire, SiC, spinel, Si, GaAs and the like. If sapphire is employed for the substrate, prior to deposition of the GaN film by epitaxial growth, a buffer layer of GaN or AlN is formed at a low temperature of approximately 550° C. in advance. After this step, the substrate is heated to a high temperature of approximately 1050° C. to achieve epitaxial growth of the GaN compound semiconductor film. It is known that this process can provide a structurally and electrically superior crystal having a good surface condition.

It is also known that if SiC is employed for the substrate, a thin AlN film is advantageously used as a buffer layer at a growth temperature for epitaxial growth. However, the use of other materials than the GaN compound semiconductor as the substrate can cause a large number of defects in a resultant GaN compound semiconductor film, due to the differences in thermal expansion coefficient and lattice constant between the grown GaN compound semiconductor film and the substrate. These defects are classified into edge dislocation and screw dislocation, and the total density of the defects can amount to approximately $1 \times 10^9$ cm$^{-2}$ to $1 \times 10^{10}$ cm$^{-2}$. These defects are known to trap carriers and accordingly degrade electrical characteristics of the prepared films, and further to shorten the life of a laser to which a great amount of current is applied.

Thus, studies have been conducted for reducing these defects and enhancing electrical characteristics of the semiconductor to be prepared. For example, a technique has been developed in which on a GaN film grown by metal organic chemical vapor deposition (MOCVD) and the like, a thick GaN film is deposited by hydride vapor-phase epitaxy (H-VPE) and the like using a mask of SiO$_2$, tungsten and the like for the purpose of preventing increase of defects such as dislocation, and the produced thick film is used as a substrate for forming a light-emitting device thereon.

SUMMARY OF THE INVENTION

However, characteristics of an n-type electrode on such a GaN substrate have not been clarified. The inventors of the present invention have found that an n-type electrode of Ti/Al or the like formed on a Ga-terminated surface of a GaN substrate has a strong tendency to exhibit Schottky characteristics. The inventors have considered that carbon (C) and the like are likely to be coupled to dangling bonds of Ga on the Ga-terminated surface. If an n-type electrode of Ti/Al or the like is formed on the Ga-terminated surface in the presence of C, a barrier layer can be produced and accordingly the electrode may exhibit Schottky characteristics. On the other hand, a film of Ni, Pd or the like constituting a p-type electrode can incorporate therein carbon (C) and the like to reduce the formation of the barrier layer. This is considered as one of the reasons for relative easiness of achieving ohmic characteristics by the p-type electrode.

In order to produce an n-type electrode of Ti/Al or the like with ohmic characteristics on the Ga-terminated surface of the GaN substrate, some steps are required, specifically including the steps of cleaning the substrate surface by hydrochloric acid and the like and annealing for producing alloy after fabrication of the electrode in order to form an intermediate product between GaN and Ti being therewith for reduction of the barrier layer. Specific contact resistance of the n-type electrode is still high even if those-steps are added.

One object of the present invention is to provide a technique of fabricating an n-type electrode in a semiconductor device structure employing a nitride semiconductor substrate such as a GaN substrate to give ohmic characteristics, without the steps of surface processing and annealing as described above.

Another object of the invention is to provide a nitride semiconductor device, particularly a light-emitting device, with a low specific contact resistance of an n-type electrode.

Still another object of the invention is to provide a nitride semiconductor device, particularly a light-emitting device, having a low threshold voltage or a low threshold current density.

The inventors have found that the ohmic characteristics can easily be obtained by fabricating an n-type electrode on an N-terminated surface of a nitride semiconductor. Further, the inventors have clarified the relation between the concentration of impurities added to a nitride semiconductor substrate and the specific contact resistance of the n-type electrode. Regarding light-emitting devices, particularly laser diode devices, the inventors have further clarified the relation between the concentration of impurities added to the nitride semiconductor substrate and threshold voltage as well as the relation between the concentration of impurities added to the nitride semiconductor substrate and threshold current density, and accordingly found a proper concentration of impurities which provides a low specific contact resistance, a low threshold voltage or a low threshold current density. The present invention has been made based on the above findings.

According to the present invention, a III-N compound semiconductor device is provided. The semiconductor device has an electrode on a nitrogen-terminated surface of the III-N compound semiconductor substrate. Specifically, the semiconductor device according to the present invention includes a III-N compound semiconductor substrate, a plurality of III-N compound semiconductor layers formed on the semiconductor substrate, and an n-type electrode and a p-type electrode for applying voltage to the semiconductor layers formed on the semiconductor substrate, wherein the semiconductor substrate is of n-type and the n-type electrode is formed on a nitrogen-terminated surface of the semiconductor substrate.

FIG. 23 illustrates a Ga-terminated surface and an N-terminated surface of GaN grown on the (0001) plane of a seed substrate, showing the seed substrate denoted by

2301, a buffer layer 2302, the Ga-terminated surface denoted by 2303B, the N-terminated surface denoted by 2303C, Ga atoms 2304 (represented by circle) and N atoms 2305 (represented by filled circle). As seen from the drawing, N atoms 2305 are predominantly projecting from N-terminated surface 2303C while Ga atoms 2304 are predominantly projecting from Ga-terminated surface 2303B.

The N-terminated surface and the Ga-terminated surface with respect to the (0001) plane of a GaN crystal can be defined here as follows. When the crystal having the exposed N-terminated surface is soaked for three minutes in an aqueous NaOH solution of 1.8 M at room temperature, its surface conditions change and hillocks of approximately 50 nm in size disappear. After such etching, roughened surface can also be observed by using atomic force microscopy (AFM), for example, at a region of 50 $\mu$m in size. Such features can be shown by the surface in which N atom comprises at least 60% of the terminated atoms, and such a surface is herein referred to as N-terminated surface. On the other hand, the Ga-terminated surface has the feature that its conditions hardly change through the same processing, and after the etching almost no change can be observed by using AFM at a region of 50 $\mu$m (see Appl. Phys. Lett. 71, 2635 (1997) for example). The surface in which Ga atom comprises at least 60% of the terminated atoms can show such a feature, and is herein referred to as Ga-terminated surface. Regarding the III-N compound semiconductor, the surface, in which N atom comprises at least 60% of the exposed terminator atoms and which has the feature that it can be easily roughened by a certain etching, can be called N-terminated surface. On the other hand, the surface, in which group III atom comprises at least 60% of the exposed terminator atoms and which has the feature that it can hardly change after a certain etching, can be called group III atom-terminated surface.

The difference in polarity (difference in terminator atom) may non-destructively be determined or evaluated by using reflection high electron energy diffraction (RHEED) (see for example Appl. Phys. Lett. 72, 2114 (1998)) or coaxial impact-collision ion scattering spectroscopy (CAICISS), instead of etching.

III-N compound semiconductors include for example GaN, AlN, $Al_xGa_{1-x}N$ (0<x<1), InN, $In_xGa_{1-x}N$ (0<x<1), $In_xGa_yAl_{1-x-y}N$ (0<x<1, 0<y<1) and the like. Specifically, in the present invention, III-N compound semiconductor Containing Ga, i.e., GaN compound semiconductor is preferably used.

Typically, in the present invention, the concentration of n-type impurities in the semiconductor substrate is in the range of $1\times10^{17}$ cm$^{-3}$ to $1\times10^{21}$ cm$^{-3}$. Preferably, the concentration of n-type impurities in the semiconductor substrate is in the range of $1\times10^{17}$ cm$^{-3}$ to $1\times10^{19}$ cm$^{-3}$. In these ranges, the concentration of n-type impurities may be constant or vary in the direction of the thickness of the substrate.

In the present invention, the n-type impurity concentration in the semiconductor substrate may be invariable or variable in the direction of the thickness of the semiconductor substrate. If the n-type impurity concentration varies in the thickness direction, the semiconductor substrate preferably includes at least a first portion forming a nitrogen-terminated surface and having a first concentration of n-type impurities and a second portion having a second concentration of n-type impurities lower than the first n-type impurity concentration. If the concentration of n-type impurities varies in the thickness direction of the substrate, the first n-type impurity concentration of the first portion is preferably at least $3\times10^{18}$ cm$^{-3}$. The first portion preferably has a thickness from 0.05 $\mu$m to 50 $\mu$m.

If the concentration of n-type impurities varies in the thickness direction of the substrate, preferably a plurality of semiconductor layers are formed on the second portion having its n-type impurity concentration lower than the first n-type impurity concentration. In this case, preferably the first portion also has a thickness from 0.05 $\mu$m to 50 $\mu$m. In addition, the first portion preferably has the first n-type impurity concentration of at least $3\times10^{18}$ cm$^{-3}$.

The semiconductor device according to the present invention is typically a light-emitting device.

According to the present invention, another semiconductor device is provided. The semiconductor device includes a III-N compound semiconductor substrate, a plurality of III-N compound semiconductor layers formed on the semiconductor substrate, and an n-type electrode and a p-type electrode for applying voltage to the semiconductor layers formed on the semiconductor substrate, wherein the semiconductor substrate is of p-type, the uppermost layer of the semiconductor layers has a nitrogen-terminated surface, and the n-type electrode is formed on the nitrogen-terminated surface. The III-N compound semiconductor is typically GaN compound semiconductor. In this case, the p-type electrode is preferably formed on a Ga-terminated surface of the semiconductor substrate. The semiconductor device according to the present invention is especially applicable to a light-emitting device.

According to the present invention, a further semiconductor device is provided. The semiconductor device includes a III-N compound semiconductor substrate, a plurality of III-N compound semiconductor layers formed on the semiconductor substrate, and an n-type electrode and a p-type electrode for applying voltage to the semiconductor layers formed on the semiconductor substrate, wherein the semiconductor substrate is of n-type, the n-type electrode is formed on a nitrogen-terminated surface of the semiconductor substrate, and the concentration of n-type impurities in the semiconductor substrate varies in the direction of the thickness of the semiconductor substrate. The semiconductor substrate is composed of a first portion forming the nitrogen-terminated surface and having a first average concentration of n-type impurities and a second portion having a second average concentration of n-type impurities lower than the first average concentration of n-type impurities. The first average n-type impurity concentration is at least $3\times10^{18}$ cm$^{-3}$ and the second average n-type impurity concentration is at most $3\times10^{18}$ cm$^{-3}$. The semiconductor layers are formed on the -second portion. The first average n-type impurity concentration is preferably in the range of $3\times10^{18}$ cm$^{-3}$ to $1\times10^{21}$ cm$^{-3}$. The second average n-type impurity concentration is preferably in the range of $1\times10^{17}$ cm$^{-3}$ to $3\times10^{18}$ cm$^{-3}$. More preferably, the first average n-type impurity concentration is in the range of $3\times10^{18}$ cm$^{-3}$ to $1\times10^{19}$ cm$^{-3}$. The III-N compound semiconductor is preferably GaN compound semiconductor. The semiconductor device according to the present invention is especially applicable to a light-emitting device.

The foregoing and other objects, features, aspects and advantages of the present invention will become more apparent from following detailed description of the present invention when taken in conjunction with the accompanying drawings.

BRIEF DESCRIPTION OF THE DRAWINGS

FIG. 25 illustrates a concentration range of impurities in a substrate used according to the present invention.

FIG. 29 shows an impurity concentration profile of a nitride semiconductor substrate used in example 12.

DESCRIPTION OF THE PREFERRED EMBODIMENTS

Figure 1:
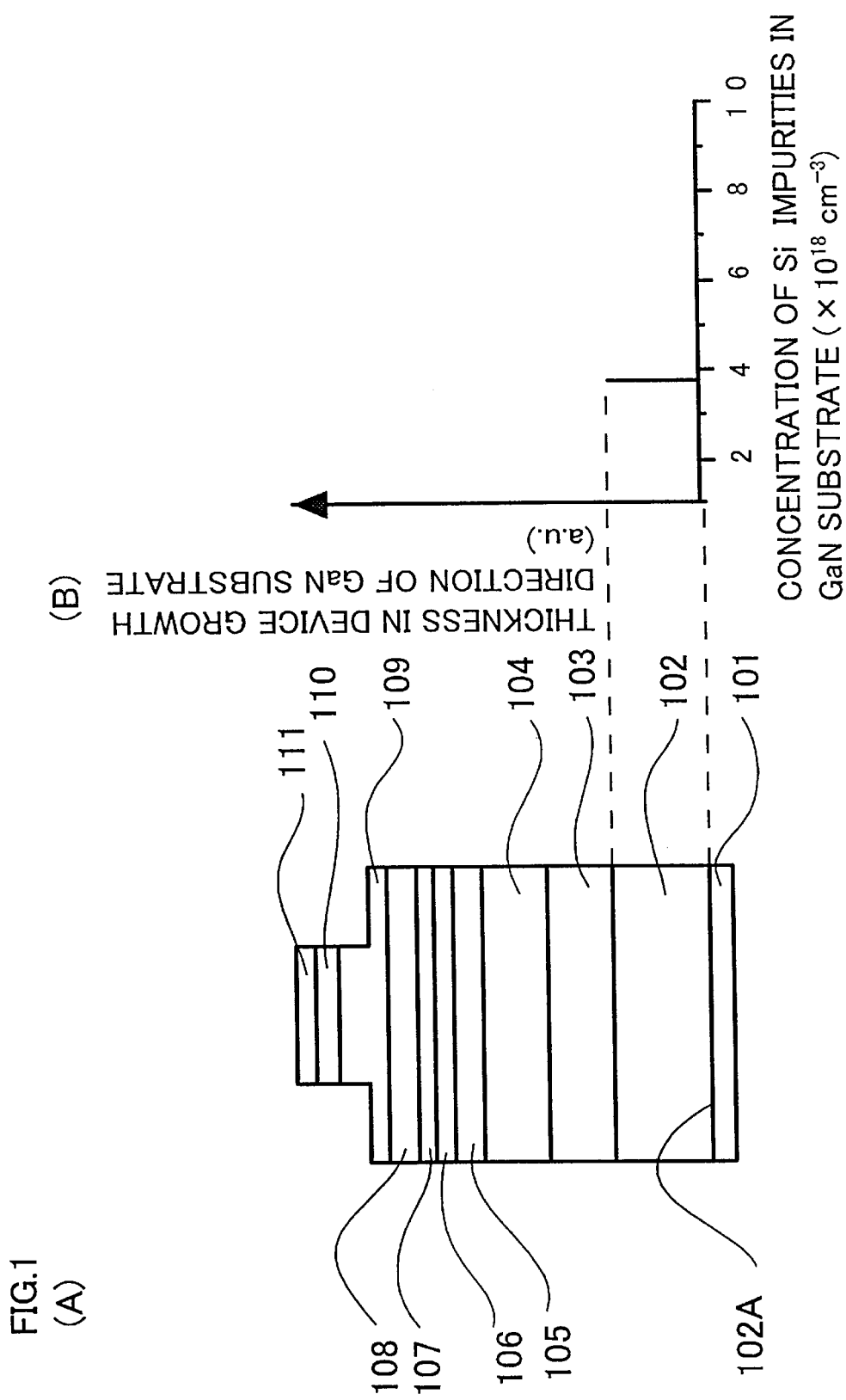
FIG. 1 shows in (A) and (B) respectively a cross section of a semiconductor laser fabricated in example 1, and an impurity concentration profile in the thickness direction of the substrate of the laser.

In the present invention, the impurity concentration can be measured by an SIMS (Secondary Ion Mass Spectrometry) apparatus for example. In the present invention, the n-type electrode can be formed of Ti/Al, Hf/Au, W/Al, V/Al and the like, by combining Au or Al with Sc, Y, La, Ti, Zr, Hf, V, Nb, Ta, W, Mo, Cr, Mn, Tc, Re or N. Another material may be used if the material exhibits superior ohmic characteristics with respect to a surface of an n-type III-N compound semiconductor.

In the present invention, the concentration of impurities in a III-N compound semiconductor substrate is preferably at least $1 \times 10^{17}$ cm$^{-3}$ and at most $1 \times 10^{21}$ cm$^{-3}$, and more preferably at least $1 \times 10^{17}$ cm$^{-3}$ and at most $1 \times 10^{19}$ cm$^{-3}$. Although Si is preferred as n-type impurities, other impurities capable of providing n-type conductivity can also be effective, similar to Si.

In the III-N compound semiconductor substrate, the portion having a higher impurity concentration preferably has a thickness which would not cause adverse unevenness of the surface. For example, the thickness is preferably from 0.05 μm to 50 μm, and more preferably from 0.05 μm to 10 μm.

According to the present invention, the III-N compound semiconductor substrate can be produced by depositing on a seed substrate a thick film of III-N compound semiconductor through epitaxial growth, and separating the resultant thick film from the seed substrate. Preferably, a sapphire substrate having the (0001) plane can be employed as the seed substrate for producing the III-N compound semiconductor substrate, particularly GaN compound semiconductor substrate. Alternatively, a sapphire substrate having another crystal plane, GaN, SiC, spinel, mica and the like may be applicable as the seed substrate. Any of the seed substrates can be employed to achieve the objects of the present invention.

For preparation of a GaN compound semiconductor substrate, preferably a GaN film can be used as a low temperature buffer layer formed on the seed substrate. The substrate can be produced by forming a thick film of GaN compound semiconductor on the low temperature buffer layer and taking out the thick film by polishing. As the low temperature buffer layer, $Al_xGa_{1-x}N$ ($0 \leq x \leq 1$) or ZnO may also be employed. Any of those materials can effectively be employed, similar to the GaN low temperature buffer layer.

In preparation of the substrate, the thick film is preferably grown by H-VPE. A laser fabricated by using a GaN substrate grown by the H-VPE can oscillate at a lower threshold voltage or a lower threshold current, compared with lasers fabricated by using GaN substrates produced through sublimation, high-pressure synthesis and other thick film growth methods respectively. In the H-VPE, HCl is used for growth, so that a thick GaN film as grown contains chlorine (Cl). The Cl can generate an intermediate product in the electrode portion and accordingly buffer an electrical barrier, and consequently superior characteristics can be obtained. However, such effects as the lower threshold voltage can be achieved even if another thick film growth method is employed instead of the H-VPE.

In the present invention, a structure of a device such as laser can be produced on the III-N compound semiconductor substrate, for example, GaN substrate, separated from the seed substrate. The device structure can preferably be produced by metal organic chemical vapor deposition (MOCVD), for example. Alternatively, on the thick GaN film being attached onto the seed substrate, a multi-layer structure of GaN compound semiconductor including a light-emitting layer may be deposited by MOCVD. After this process, a GaN compound semiconductor laser can be produced by removing the seed substrate, an underlying undoped GaN film and a mask by polishing, and such a laser can give favorable characteristics as those obtained by using the substrate which is first separated from the seed substrate.

In the present invention, the GaN substrate can preferably be used. However, those substrates formed of other GaN compound semiconductors or other III-N compound semiconductors may also be used. Among the elements composing the GaN compound semiconductor, the nitrogen element may partially (approximately 10% or less) be replaced with an element selected from the group consisting of P, As and Sb. Those materials can also provide similar effects.

In the present invention, a substrate of a hexagonal crystal grown in the direction of the c-axis is preferably used. In this case, on an N-terminated surface and a Ga-terminated surface of the substrate, the C plane of the hexagonal crystal is exposed. This substrate can be produced through epitaxial growth on the (0001) plane of the seed substrate. Alternatively, a thick film grown on another crystal plane may be used as the substrate. Examples of such growth include growth on the M plane (01-10) in the direction of <01-13> of the GaN, growth on the A plane (2-1-10) in the c-axis direction of the GaN, growth on the R plane (011-2) in the direction of <2-1-10> of the GaN, and growth on the {(111) plane+slightly inclined plane} of the cubic crystal in the direction of the c-axis of GaN. These examples of the growth can also provide an N-terminated surface for an n-type electrode.

In the present invention, if the employed substrate has a major surface on which the C crystal plane is exposed, the c-axis of the substrate crystal may preferably deviate from the direction perpendicular to the major surface of the substrate (direction in which the crystal is deposited) by 0.10° to 0.25°, more preferably by 0.15° to 0.20°. Owing to this, the flatness of the surface of the crystal grown on the substrate and crystalline characteristics of the entire device can improved, so that the active layer and device characteristics can further be improved.

MOCVD is preferably employed for fabricating a device structure such as laser on the substrate. Alternatively, other epitaxial growth methods such as molecular beam epitaxy (MBE) may be used. The materials used in MOCVD include trimethylgallium (TMG), trimethylaluminum (TMA), trimethylindium (TMI), $NH_3$ and bis cyclopentadienyl magnesium ($Cp_2Mg$), for example. Other materials may also be used as far as they can cause growth of a necessary compound. Si, Ge, Sn, O, S, Se or Te as an n-type dopant, and Mg, Be, Ca, Sr, Ba, Zn or Cd as a p-type dopant can be used for doping the III-N compound semiconductor substrate, particularly the GaN substrate, as well as the device structure such as laser and the like.

The present invention is specifically applied to light-emitting devices. The light-emitting devices include a laser and a light-emitting diode (LED), for example. For the laser, a low specific contact resistance, a low threshold voltage or a low threshold current density can be achieved by the present invention. For the light-emitting diode, reduction of voltage for drive as well as improvement in the surface flatness can be achieved by the present invention.

(A) of FIG. 1 shows one example of a semiconductor device according to the present invention applied as a semiconductor laser. On one major surface 102A of a GaN substrate 102, an n-type electrode 101 is formed. Major surface 102A being in contact with n-type electrode 101 is a N-terminated surface. On the other major surface of GaN substrate 102, an n-type GaN layer 103, an n-type $Al_{0.1}Ga_{0.9}N$ cladding layer 104, an n-type GaN light guiding layer 105, a light-emitting layer 106 of multiple quantum wells, a p-type $Al_{0.2}Ga_{0.8}N$ carrier blocking layer 107, a p-type GaN light guiding layer 108, a p-type $Al_{0.1}Ga_{0.9}N$ cladding layer 109, a p-type GaN contact layer 110, and a p-type electrode 111 are formed in this order. A process of fabricating this semiconductor laser is now described.

EXAMPLE 1

A thick GaN film was grown on a sapphire substrate by H-VPE and the resultant thick film was used as a substrate to prepare the semiconductor laser shown in (A) of FIG. 1 as described below.

The sapphire substrate having the (0001) plane was first cleaned. An undoped GaN film of approximately 3 $\mu$m in thickness was then grown as an underlayer by MOCVD, according to the procedure described below. The cleaned substrate was placed into an MOCVD system to clean the substrate under an $H_2$ atmosphere at a high temperature of 1100° C. The temperature was lowered, and hydrogen ($H_2$) was flown at 10 L/min as a carrier gas while $NH_3$ and trimethylgallium (TMG) were supplied respectively at 5 L/min and 20 mol/min at 600° C., to cause growth of a low temperature GaN buffer layer having a thickness of approximately 20 nm.

Supply of the TMG was then stopped temporarily, the temperature was raised again to 1050° C., and then the TMG was supplied at approximately 100 mol/min to grow an undoped GaN film to 3 $\mu$m in thickness for one hour. Supply of the TMG and $NH_3$ was then stopped, the temperature was lowered to room temperature, and the sapphire substrate having thereon the grown undoped GaN underlayer was taken out. As the low temperature buffer layer, instead of the GaN film, an AlN film or GaAlN film may be formed by using trimethylaluminum (TMA), TMG and $NH_3$.

A thick GaN film was grown on the undoped GaN underlayer (whose outermost surface was a Ga-terminated surface) fabricated by the above method. At this time, in order to avoid cracks, a growth inhibiting film of 2000 Å in thickness was formed having a stripe pattern with lines of 7 $\mu$m in width arranged at intervals of 10 $\mu$m, and then a planar and thick GaN film was deposited thereon through selective growth by H-VPE. In this example, the growth inhibiting film employed was produced by forming a $SiO_2$ film by electron beam vapor deposition and etching the film by photolithography. The sapphire substrate having the undoped GaN underlayer film partially covered with the stripe-shaped growth inhibiting film was brought into an H-VPE system. $N_2$ carrier gas and $NH_3$ were flown each at 5 L/min while the substrate was heated to approximately 1050° C. Then GaCl was supplied onto the substrate at 100 cc/min to start growth of the thick GaN film. The GaCl was generated by flowing HCl gas to Ga metal kept at 850° C. During the growth, doping was optionally possible by supplying an impurity gas through an impurity doping line separately extended to the neighborhood of the substrate. In this example, for doping with Si, monosilane ($SiH_4$) was supplied at 200 nmol/min simultaneously with the start of the growth and an Si doped GaN layer (Si impurity concentration: $3.8 \times 10^{18}$ cm$^{-3}$) was grown. In this way, a thick GaN film of 350 $\mu$m was produced through total growth for 3 hours. The outermost surface of the GaN produced under these growth conditions was a Ga-terminated surface. Regarding doping with Si, other materials such as monochlorosilane ($SiH_3Cl$), dichlorosilane ($SiH_2Cl_2$), trichlorosilane ($SiHCl_3$) and the like may be used instead of $SiH_4$.

After the growth, the sapphire substrate, the undoped GaN film obtained by the MOCVD and the $SiO_2$ film were removed by polishing, and the polishing was continued until an N-terminated surface was exposed to produce GaN substrate 102 shown in (A) of FIG. 1. The polished surface of the GaN substrate was the N-terminated surface and the outermost surface opposite thereto was the Ga-terminated surface.

The obtained thick GaN film was used as a substrate to grow a light-emitting device structure by MOCVD as described below. First, the substrate was placed into an MOCVD system, and $N_2$ and $NH_3$ were flown each at 5 L/min while the temperature was raised to 1050° C. At the raised temperature, the carrier gas $N_2$ was replaced with $H_2$, and TMG and $SiH_4$ were supplied respectively at 100 $\mu$mol/min and 10 nmol/min to cause 4 $\mu$m growth of n-type GaN layer 103 shown in FIG. 1. The flow rate of the TMG was then adjusted to 50 $\mu$mol/min and TMA was supplied at 40 $\mu$mol/min to grow n-type $Al_{0.1}Ga_{0.9}N$ cladding layer 104 of 0.5 $\mu$m in thickness. After the growth of $Al_{0.1}Ga_{0.9}N$, supply of the TMA was stopped and the flow rate of the TMG was adjusted to 100 $\mu$mol/min to grow n-type GaN light guiding layer 105 of 0.1 $\mu$m in thickness. Supply of the TMG and $SiH_4$ was then stopped, the carrier gas was changed from $H_2$ to $N_2$ again, the temperature was lowered to 700° C., and trimethylindium (TMI) as an indium source and TMG were supplied respectively at 10 $\mu$mol/min and 15 $\mu$mol/min to grow a barrier layer of 4 nm in thickness formed of $In_{0.05}Ga_{0.95}N$ Then, the supply amount of TMI was increased to 50 $\mu$mol/min to cause growth of a well layer of 2 nm in thickness formed of $In_{0.2}Ga_{0.8}N$. Total three well layers were grown by a similar method and light-emitting layer 106 of the multiple quantum wells (MQW) in which total four barrier layers were present between the well layers and on both sides thereof. After the growth of the MQW, supply of the TMI and TMG was stopped, the temperature was raised again to 1050° C., the carrier gas was changed again from $N_2$ to $H_2$, and TMG at 50 $\mu$mol/min, TMA at 30 $\mu$mol/min and bis cyclopentadienyl magnesium ($Cp_2Mg$) as a p-type dopant at 10 nmol/min were flown. Accordingly, p-type $Al_{0.2}Ga_{0.8}N$ carrier blocking layer 107 having a thickness of 20 nm was grown. After the growth of the carrier blocking layer, supply of the TMA was stopped and the supply amount of TMG was adjusted to 100 $\mu$mol/ min to grow p-type GaN light guiding layer 108 of 0.1 $\mu$m in thickness. Then, the supply amount of TMG was adjusted to 50 $\mu$mol/min and TMA was supplied at 40 $\mu$mol/min to grow $Al_{0.1}Ga_{0.9}N$ cladding layer 109 of 0.4 $\mu$m in thickness. Finally, the supply amount of TMG was adjusted to 100 $\mu$mol/min, supply of the TMA was stopped, and accordingly p-type GaN contact layer 110 of 0.1 $\mu$m in thickness was grown. In this way, growth of the light-emitting device structure was completed. After the growth is completed, supply of the TMG and $Cp_2Mg$ was stopped, the temperature was lowered to room temperature, and the substrate was taken out of the MOCVD system.

Then, using a dry etching system, p-GaN contact layer 110 was shaped in a stripe pattern with a line width of 5 $\mu$m, and etching was performed on p-$Al_{0.1}Ga_{0.9}N$ light guiding layer 109 to produce an optical waveguide. On the p-GaN portion, Pd of 150 Å and Au of 1000 Å were deposited by vapor deposition successively to form p-type electrode 111. The temperature of the substrate was maintained at approximately 200° C., and Ti of 150 Å and Al of 1000 Å in thickness were deposited by vapor deposition successively on N-terminated surface 102A of the GaN substrate to form n-type electrode 101. Finally, the device length was set to approximately 1 mm by cleavage or dry etching, generating end mirror surfaces.

In the semiconductor laser produced through the process described above, the concentration profile of impurities in the GaN substrate was as shown in (B) of FIG. 1. In the direction of the thickness of n-type GaN substrate 102, the concentration of n-type impurities (Si) was substantially constant and was $3.8 \times 10^{18}$ cm$^{-3}$. The laser fabricated in this example had a threshold voltage of approximately 5 V and a threshold current density of 1.2 kA/cm$^2$ regarding laser emission. On this laser, life test was conducted under conditions near the threshold for about 1000 hours, and no change was observed in its characteristics.

Comparative Example 1

Figure 2:
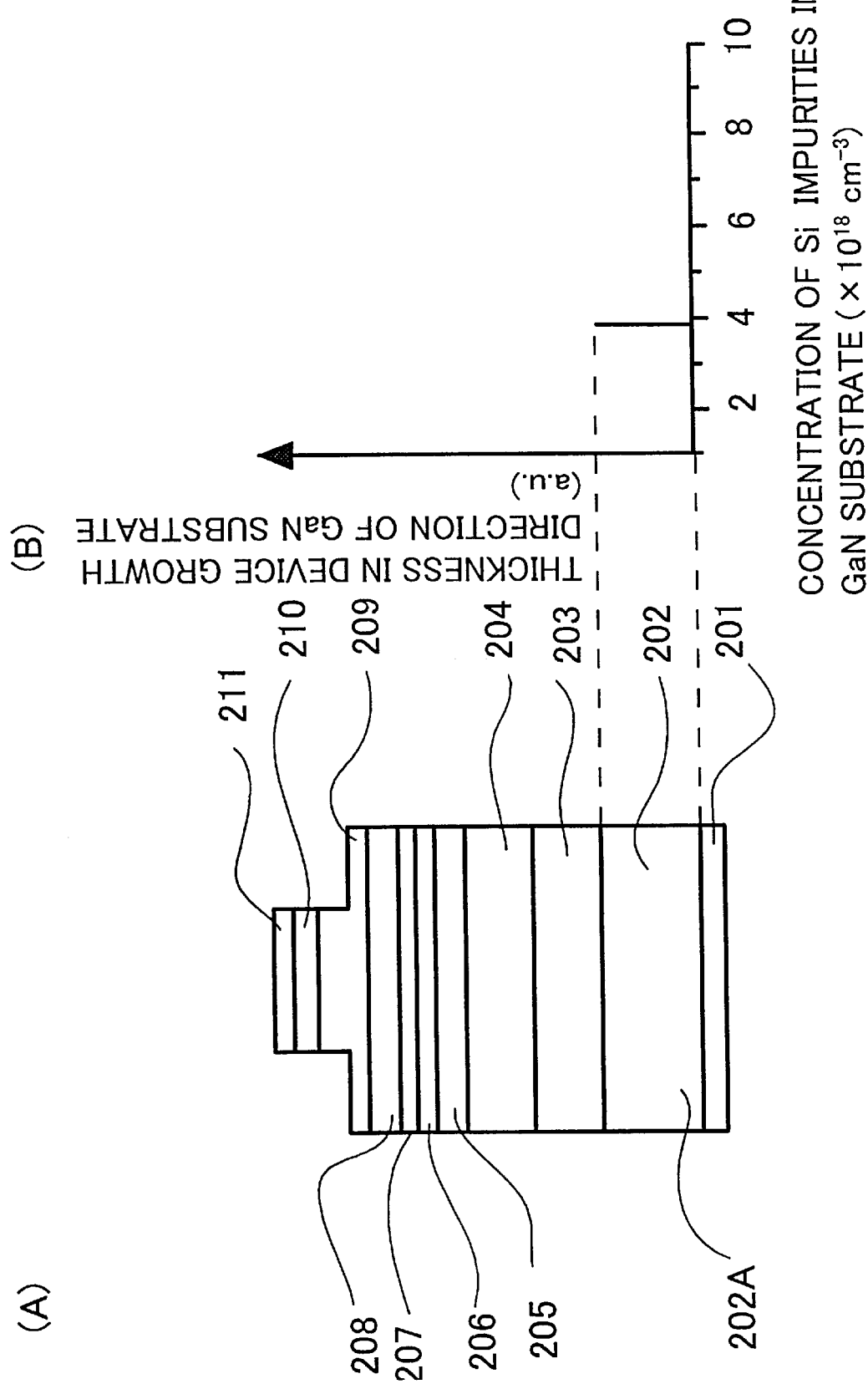
FIG. 2 shows in (A) and (B) respectively a cross section of a semiconductor laser fabricated in comparative example 1, and an impurity concentration profile in the thickness direction of the substrate of the laser.

A laser was fabricated by epitaxial growth of each layer on the N-terminated surface of the GaN substrate produced in example 1 and by formation of an n-type electrode on the Ga-terminated surface. (A) of FIG. 2 shows a cross section of the fabricated laser of GaN compound semiconductor and (B) of FIG. 2 shows an impurity concentration profile in the direction of growth (thickness) of the GaN substrate. The laser was prepared through the process below.

Preparation of an undoped GaN film by MOCVD and an $SiO_2$ film as well as the growth by H-VPE were done similarly to those in example 1. Then, the N-terminated surface of the GaN substrate was used as a surface for epitaxial growth, and similar to the process in example 1, an n-type GaN layer 203, an n-type $Al_{0.1}Ga_{0.9}N$ cladding layer 204, an n-type GaN light guiding layer 205, a light-emitting layer 206 of multiple quantum wells, a p-type $Al_{0.2}Ga_{0.8}N$ carrier blocking layer 207, a p-type GaN light guiding layer 208, a p-type $Al_{0.1}Ga_{0.9}N$ cladding layer 209, a p-type GaN contact layer 210, and a p-type electrode 211 were formed on GaN substrate 202, and an n-type electrode 201 was further formed on Ga-terminated surface 202A.

The resulting device generated no laser emission at room temperature.

Figure 3:
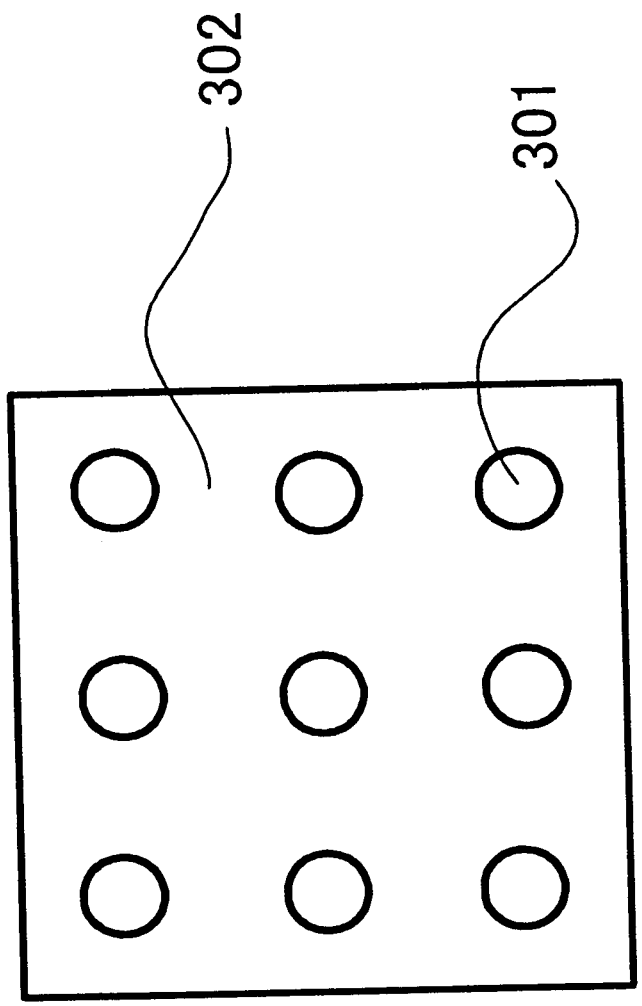
FIG. 3 is a plan view of an N-terminated or Ga-terminated surface of a GaN substrate showing a pattern of n-type electrodes vapor-deposited thereon.
Figure 4:
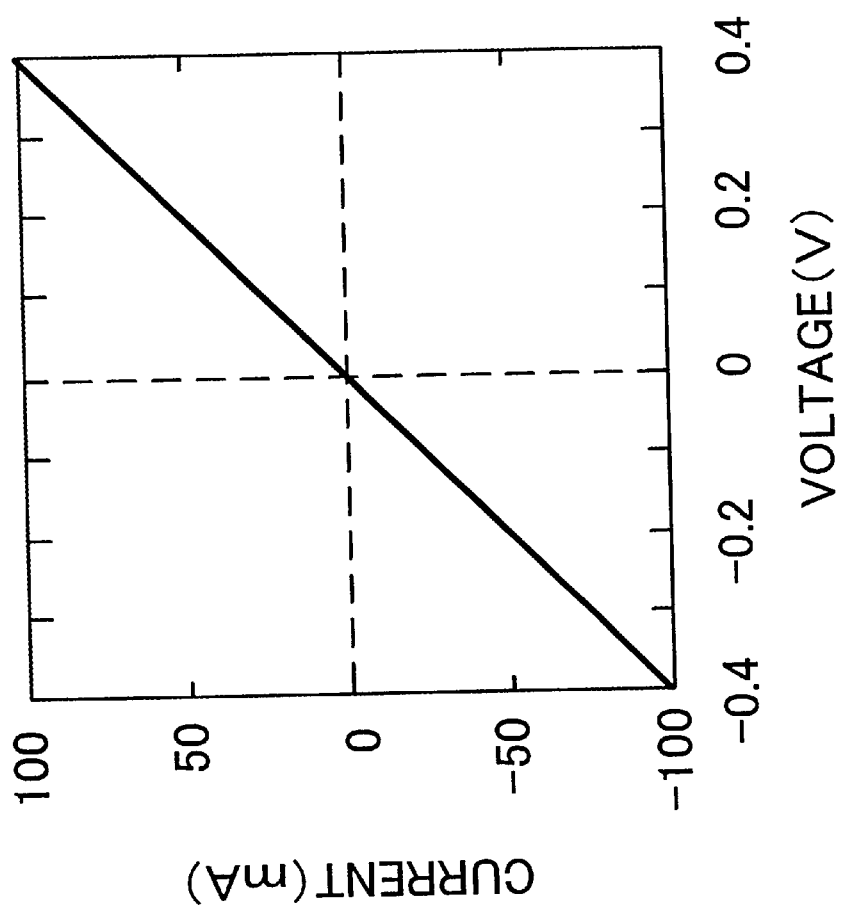
FIG. 4 shows current-voltage characteristics of an n-type electrode vapor-deposited on the N-terminated surface of a GaN substrate.
Figure 5:
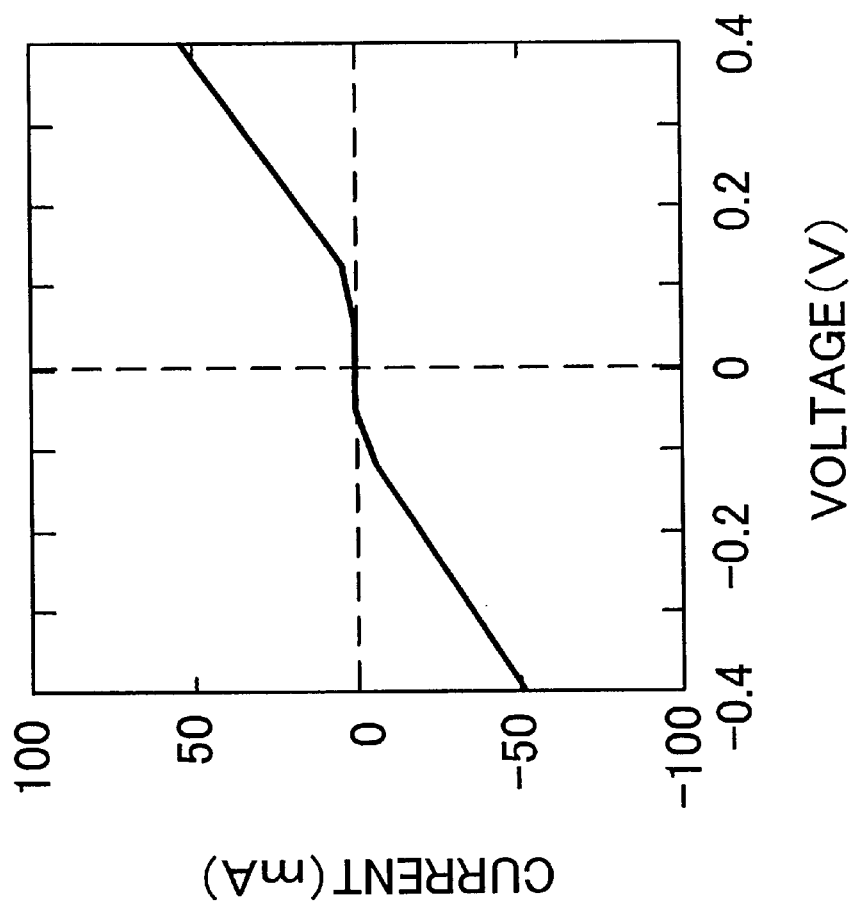
FIG. 5 shows current-voltage characteristics of an n-type electrode vapor-deposited on the Ga-terminated surface of a GaN substrate.

In order to find the reason why no laser emission was observed, a GaN substrate was prepared in a similar manner to that in example 1, and total 18 Ti (150 Å)/Al (1000 Å) electrodes 201 each with a diameter of 0.5 mm were formed successively by vapor deposition, in which nine electrodes were deposited respectively on the N-terminated surface and the Ga-terminated surface at intervals of 1.0 mm, and their voltage-current characteristics were examined. FIG. 3 shows a pattern of the n type electrodes which were vapor-deposited on the N-terminated surface or the Ga-terminated surface of the GaN substrate, where the n-type electrode and the GaN substrate are denoted respectively by 301 and 302. FIG. 4 shows current-voltage characteristics of the n-type electrodes deposited on the N-terminated surface of the GaN substrate and FIG. 5 shows current-voltage characteristics of the n-type electrodes deposited on the Ga-terminated surface of the GaN substrate. As shown in FIG. 4, the n-type electrodes on the N-terminated surface exhibit superior ohmic characteristics. On the other hand, the n-type electrodes on the Ga-terminated surface exhibit Schottky characteristics as shown in FIG. 5 to suggest presence of a barrier layer.

C and the like are likely to be coupled to the dangling bond of Ga present on the Ga-terminated surface. Therefore, when electrodes of Ti/Al or the like are prepared in the presence of C and the like, a barrier layer can be produced and the prepared electrodes could exhibit Schottky characteristics. On the N-terminated surface, the possibility of the presence of atoms capable of forming such a barrier is low. Accordingly, n-type electrodes exhibiting favorable ohmic characteristics can be produced on the N-terminated surface without surface processing.

Epitaxial growth of the GaN compound semiconductor layer on the Ga-terminated surface is carried out at a high temperature of at least 1000° C. In such a case, impurities should be taken off or cleaned out from the surface, so that favorable GaN compound semiconductor layers can be formed on the surface.

EXAMPLE 2

The amount of the supplied dopant source $SiH_4$ was varied in the range of 10 nmol/min to 1000 nmol/min and thick GaN films having different impurity concentrations respectively were grown by H-VPE. During the growth of each thick GaN film, the flow rate of $SiH_4$ was made constant. Other conditions were similar to those in example 1. Resulting thick GaN films were used as substrates to fabricate lasers in a similar manner to that in example 1 and their characteristics were measured. Respective layers of the laser were epitaxially grown on the Ga-terminated surface of the GaN substrate. An n-type electrode was formed on the N-terminated surface of the GaN substrate.

Figure 6:
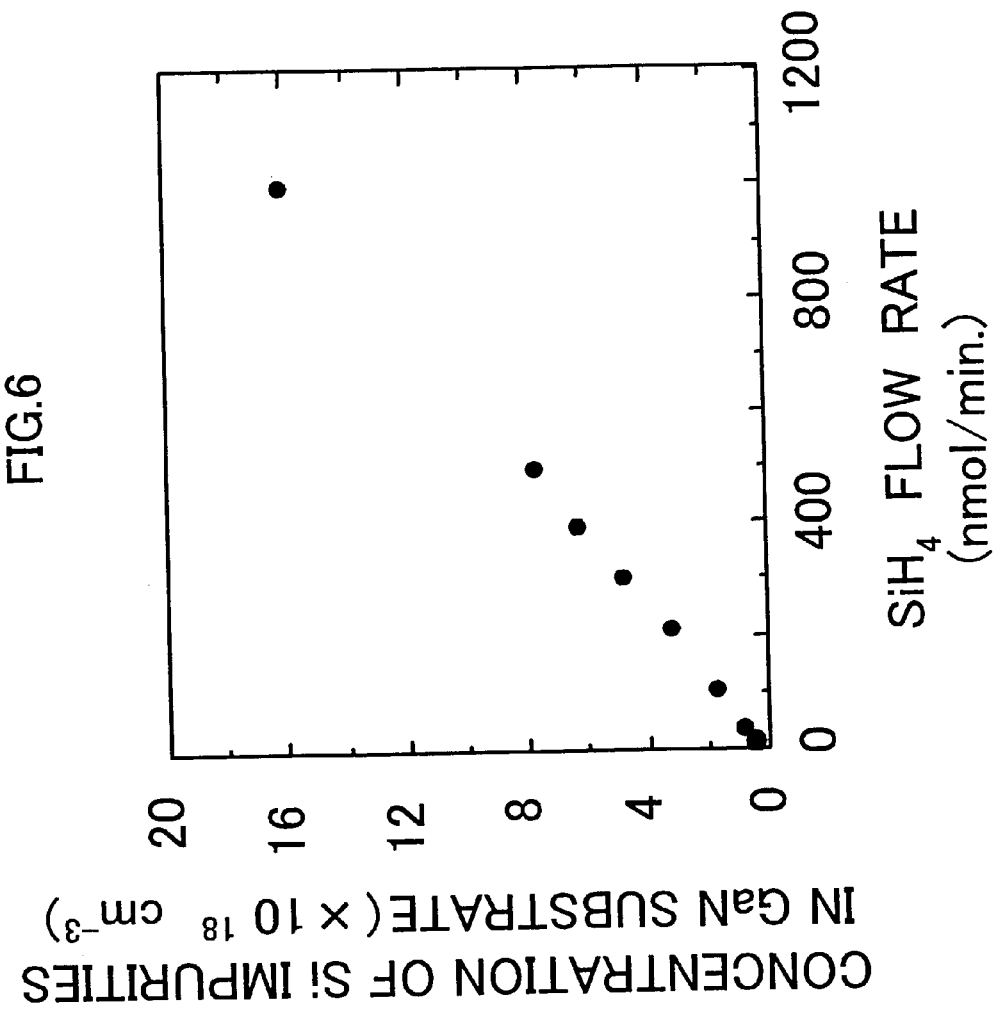
FIG. 6 shows a relation between an amount of $SiH_4$ supplied for growth of a thick GaN film and the concentration of impurities contained in the resultant film.
Figure 7:
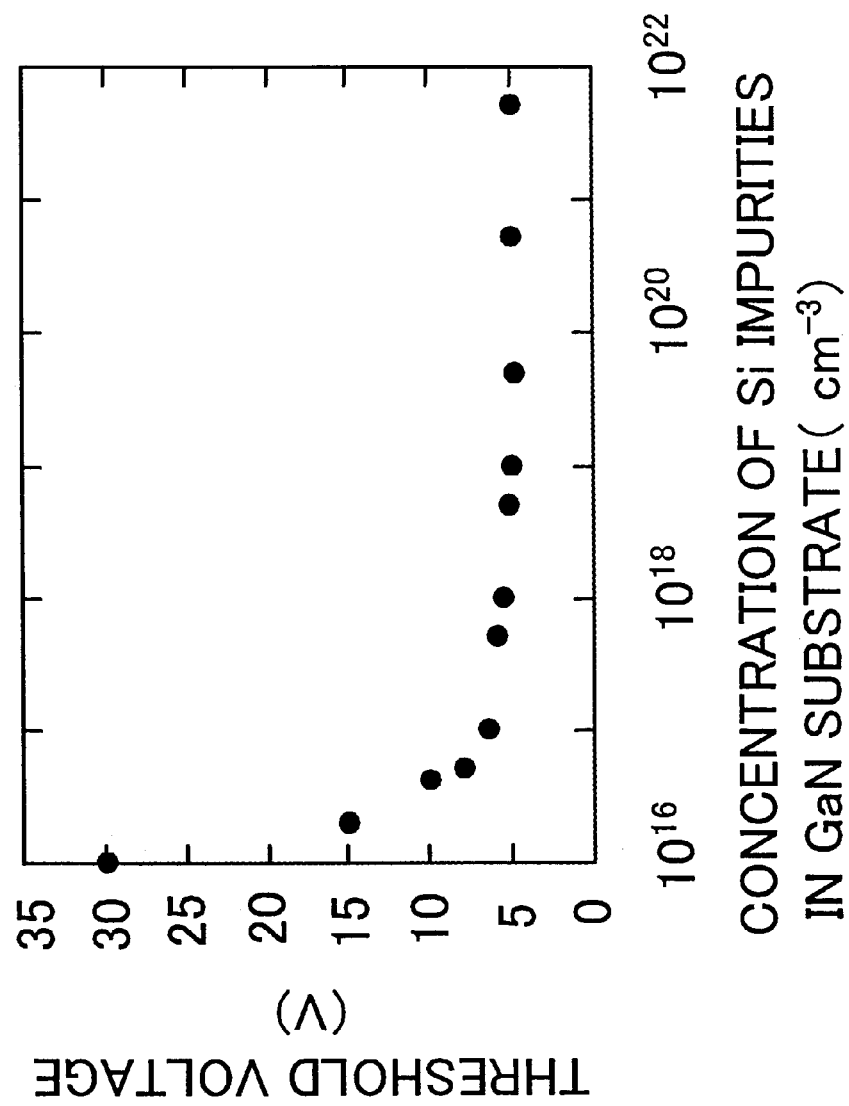
FIG. 7 shows a relation between the concentration of impurities in a GaN substrate and the threshold voltage of a laser employing a GaN substrate.
Figure 8:
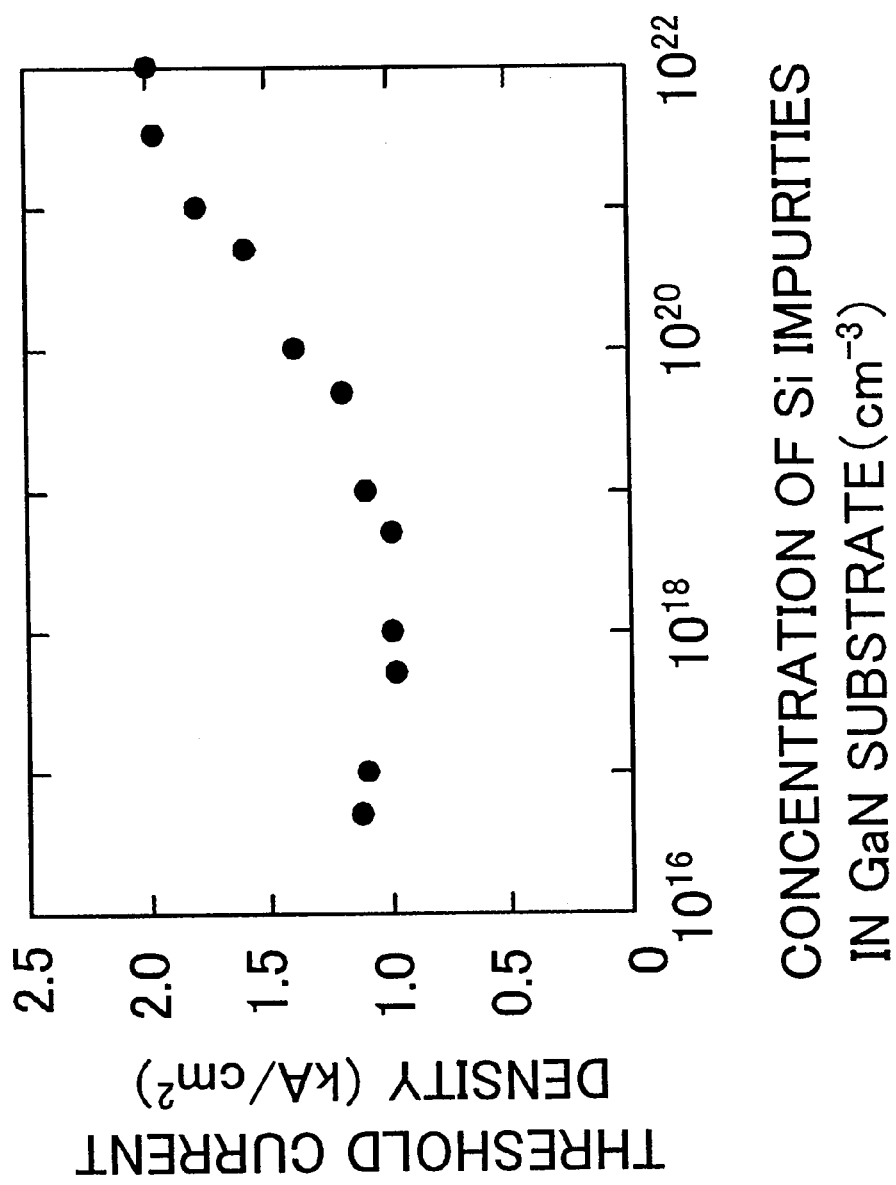
FIG. 8 shows a relation between the concentration of impurities in a GaN substrate and the threshold current density of a laser employing a GaN substrate.
Figure 9:
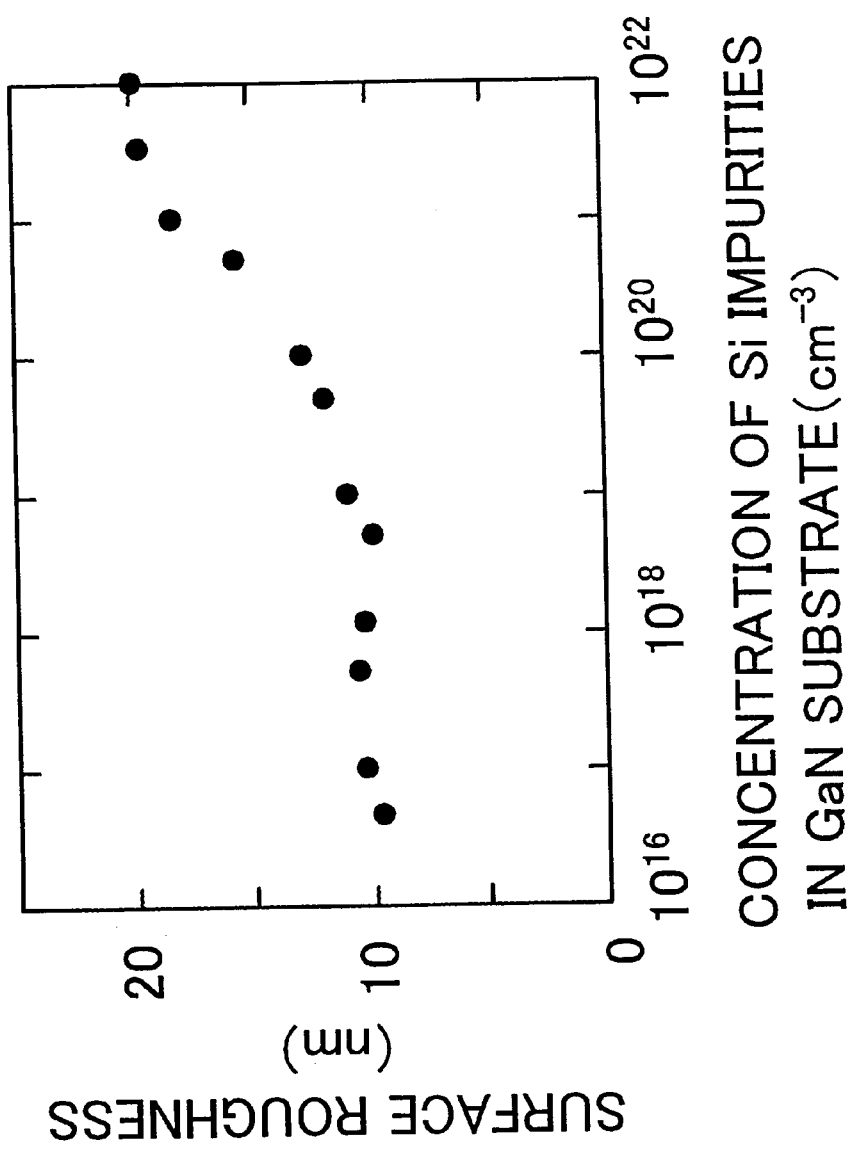
FIG. 9 shows a relation between the concentration of impurities in a GaN substrate and surface roughness of the GaN substrate.

FIG. 6 shows a relation between an amount of supplied $SiH_4$ during the growth and the concentration of impurities contained in the thick GaN film. FIG. 7 shows a relation between the concentration of impurities in the GaN substrate and threshold voltage of the laser fabricated by using that GaN substrate. FIG. 8 shows a relation between the concentration of impurities in the GaN substrate and threshold current density of the laser fabricated by using that GaN substrate. FIG. 9 shows a relation between the concentration of impurities in the GaN substrate: and surface roughness of that GaN substrate.

As shown in FIG. 6, the amount of supplied $SiH_4$ is proportional to the concentration of impurities in the GaN substrate. When the amount of supplied $SiH_4$ is 1000 nmol/ml, the impurity concentration is $1.6 \times 10^{19}$ cm$^{-3}$. As shown in FIG. 7, with the increase of the concentration of impurities in the GaN substrate, the threshold voltage of the fabricated laser tends to gradually decrease. This may be due to decreased resistance of the GaN substrate by impurities.

However, a decrease in the specific contact resistance due to the reduced Schottky barrier between the N-terminated surface and the n-type electrode may more significantly contribute to the decrease in the threshold voltage. The threshold voltage converges substantially to 5V when the concentration of impurities in the GaN substrate is approximately $1 \times 10^{17}$ cm$^{-3}$ or more.

On the contrary, as shown in FIG. 8, when the concentration of impurities in the GaN substrate is approximately $1 \times 10^{19}$ cm$^{-3}$ or more, the threshold current density of the laser gradually increases to reach approximately 2 kA/cm$^2$ at a concentration of $5 \times 10^{21}$ cm$^{-3}$ or more. As shown in FIG. 9, this may be due to the event that the average roughness of the film surface starts to increase when the concentration of impurities in the GaN substrate exceeds approximately $1 \times 10^{19}$ cm$^{-3}$. In other words, each interface between the layers in the laser structure grown on the film can be rendered more uneven by the increased roughness of the film surface, so that scattering of light in the guiding layer transmitting the laser beam can be increased, resulting in a higher threshold current density.

In addition, n-type electrodes were fabricated on the N-terminated surface of the GaN substrate employed for producing the laser and the specific contact resistance was measured by Transmission Line Model (TLM) method as to different impurity concentrations. In this method, samples to be examined are supposed to have a uniform surface and the specific contact resistance is determined from the dependency on the distance between electrodes. An electrode pad pattern employed here was of Ti (150 Å)/Al (1000 Å), 300×300 μm in size, and 10 to 100 μm intervals.

Figure 10:
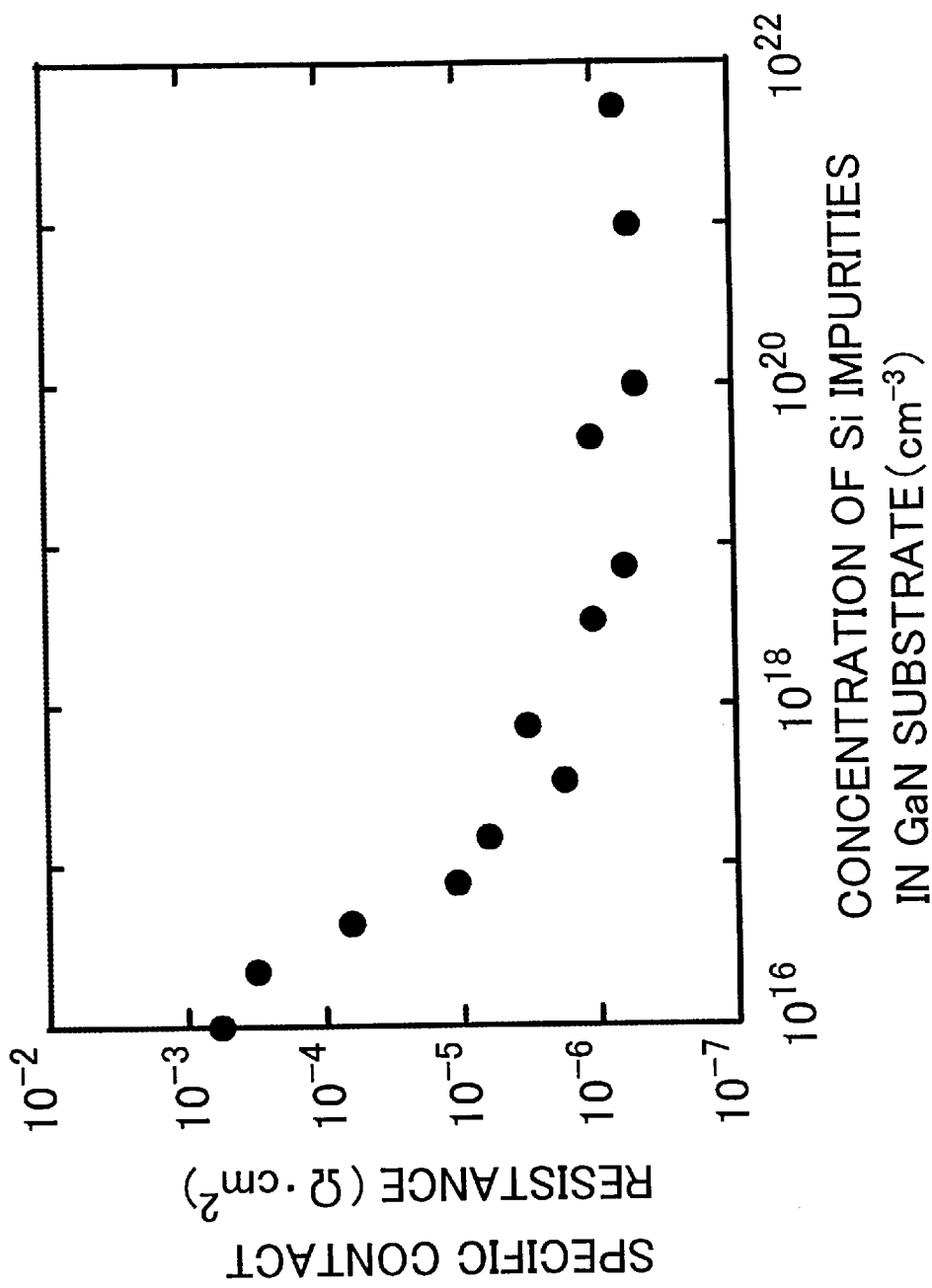
FIG. 10 shows a relation between the concentration of impurities in a GaN substrate and specific contact resistance of an n-type electrode.

FIG. 10 shows a relation between the concentration of impurities in the GaN substrate and the specific contact resistance. When the impurity concentration exceeds $1 \times 10^{17}$ cm$^{-3}$, the specific contact resistance becomes $1 \times 10^{-5}$ Ω·cm$^2$ or less, and then the specific resistance decreases with increase of the impurity concentration.

From the above result, the concentration of impurities in the GaN substrate is preferably at least $1 \times 10^{17}$ cm$^{-3}$ and at most $1 \times 10^{21}$ cm$^{-3}$, and more preferably at least $1 \times 10^{17}$ cm$^{-3}$ and at most $1 \times 10^{19}$ cm$^{-3}$. If the impurity concentration is too low, the resistance of the substrate itself increases and an intermediate product is generated between the electrode and the GaN substrate, possibly making it difficult to reduce the barrier. On the other hand, if the impurity concentration is too high, the growth surface becomes rough to degrade the crystallinity of the re-grown crystal and possibly degrade device characteristics. More preferable characteristics can be achieved by fabricating the n-type electrode on the N-terminated surface of the substrate having a suitable impurity concentration.

EXAMPLE 3

Figure 11:
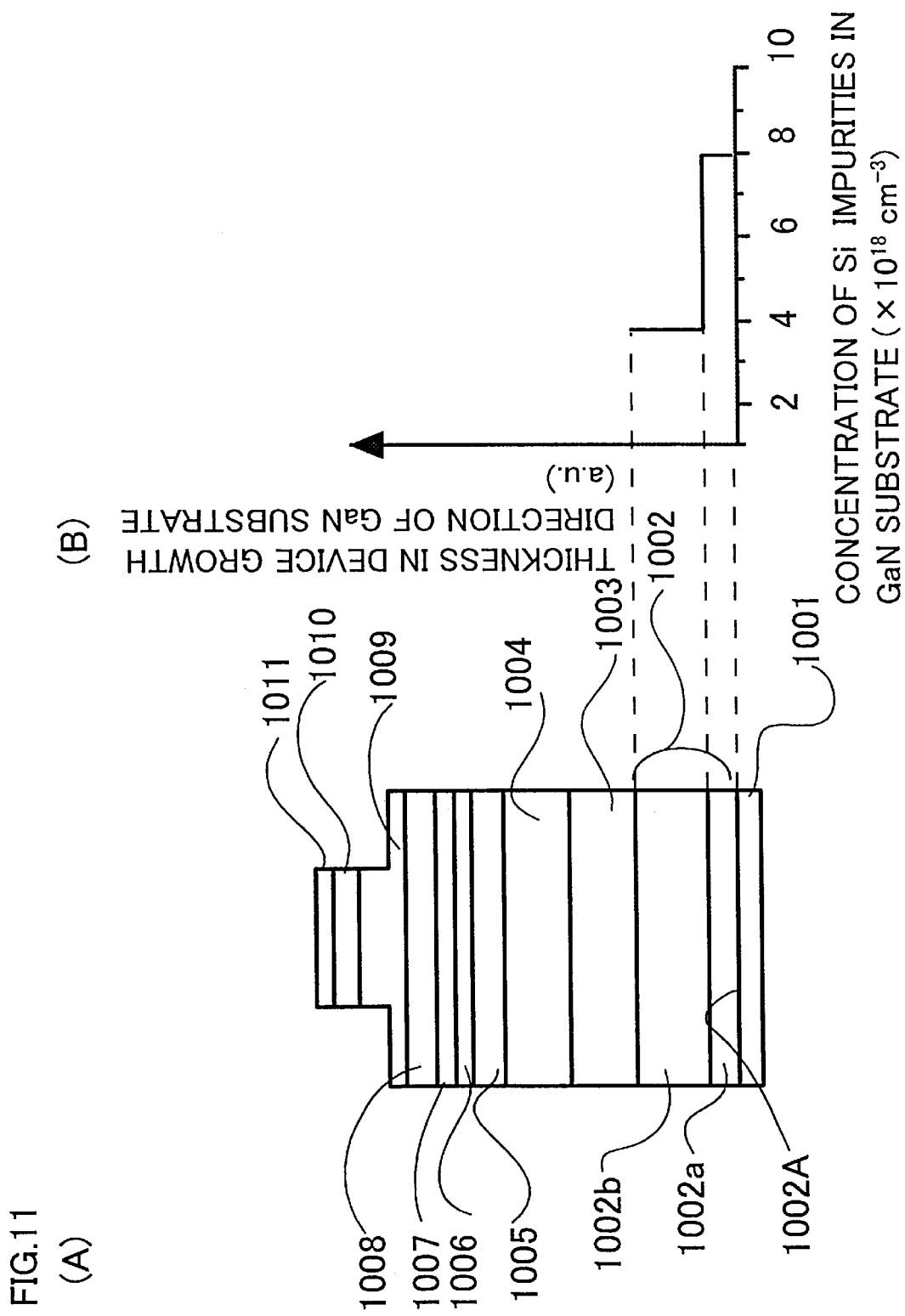
FIG. 11 shows in (A) and (B) respectively a cross section of a semiconductor laser fabricated in example 3 and an impurity concentration profile in the thickness direction of the substrate of the laser.

A laser device was prepared as explained below by varying the concentration of carriers in the GaN substrate. FIG. 11 shows in (A) and (B) respectively a cross section of the fabricated laser of GaN compound semiconductor and a concentration profile of impurities in the direction of the thickness of the GaN substrate. GaN substrate 1002 herein employed was composed of an Si-highly-doped GaN layer 1002B (Si impurity concentration: $8.0 \times 10^{18}$ cm$^{-3}$) and an Si-normally-doped GaN layer 1002C (Si impurity concentration: $3.8 \times 10^{18}$ cm$^{-3}$). An n-type electrode 1001 was formed on the N-terminated surface 1002A of substrate 1002. GaN layer 1002B forming the N-terminated surface being in contact with n-type electrode 1001 had a higher impurity concentration than that of GaN layer 1002C being in contact with the laser structure. A process of fabrication is described below.

An undoped GaN film by MOCVD and an $SiO_2$ film were fabricated in a manner similar to example 1. Growth by H-VPE was then carried out as described below.

A sapphire substrate having the undoped GaN underlayer and the stripe-shaped growth inhibiting film was first placed into an H-VPE system. $N_2$ carrier gas and $NH_3$ were flown each at 5 L/min while the substrate was heated to approximately 1050° C. Then GaCl was supplied onto the substrate at 100 cc/min to start growth of the thick GaN film. The GaCl was generated by flowing HCl gas to Ga metal kept at 850° C. During the growth, doping was optionally possible by supplying an impurity gas through an impurity doping line separately extended to the neighborhood of the substrate. The growth was started with Si-doping, monosilane ($SiH_4$) was supplied at 500 nmol/min and Si-highly-doped GaN layer 1002B (Si impurity concentration: $8.0 \times 10^{18}$ $cm^{-3}$) was grown to 5 $\mu$m. The flow rate of $SiH_4$ was then changed to 200 nmol/min and Si-normally-doped GaN layer 1002C (Si impurity concentration: $3.8 \times 10^{18}$ $cm^{-3}$) was grown, resulting in a thick GaN film of 350 $\mu$m through the total growth for 3 hours. The outermost surface (epitaxial surface) of the GaN produced under these conditions was a Ga-terminated surface. Regarding doping with Si, other materials such as monochlorosilane ($SiH_3Cl$), dichlorosilane ($SiH_2Cl_2$), trichlorosilane ($SiHCl_3$) may be used instead of $SiH_4$.

After the growth, the sapphire substrate, the undoped GaN film obtained by the MOCVD and the $SiO_2$ film were removed by polishing, and the polishing was continued until an N-terminated surface was exposed to produce GaN substrate 1002. The obtained substrate of the thick GaN film was used to form epitaxial growth layers on the Ga-terminated surface opposite to N-terminated surface 1002A by MOCVD, resulting in a light-emitting device structure. Similarly to the process in example 1, an n-type GaN layer 1003, an n-type $Al_{0.1}Ga_{0.9}N$ cladding layer 1004, an n-type GaN light guiding layer 1005, a light-emitting layer 1006 of multiple quantum wells, a p-type $Al_{0.2}Ga_{0.8}N$ carrier blocking layer 1007, a p-type GaN light guiding layer 1008, a p-type $Al_{0.1}Ga_{0.9}N$ cladding layer 1009, a p-type GaN contact layer 1010, and a p-type electrode 1011 were formed, and an n-type electrode 1001 was fabricated on the N-terminated surface 1002A of the GaN substrate, to give the device.

The resulting laser had a threshold voltage of approximately 5 V and a threshold current density of 1.0 $kA/cm^2$. A life test was conducted for about 1500 hours under conditions close to the threshold and no particular change in characteristics was observed.

Comparative Example 2

Figure 12:
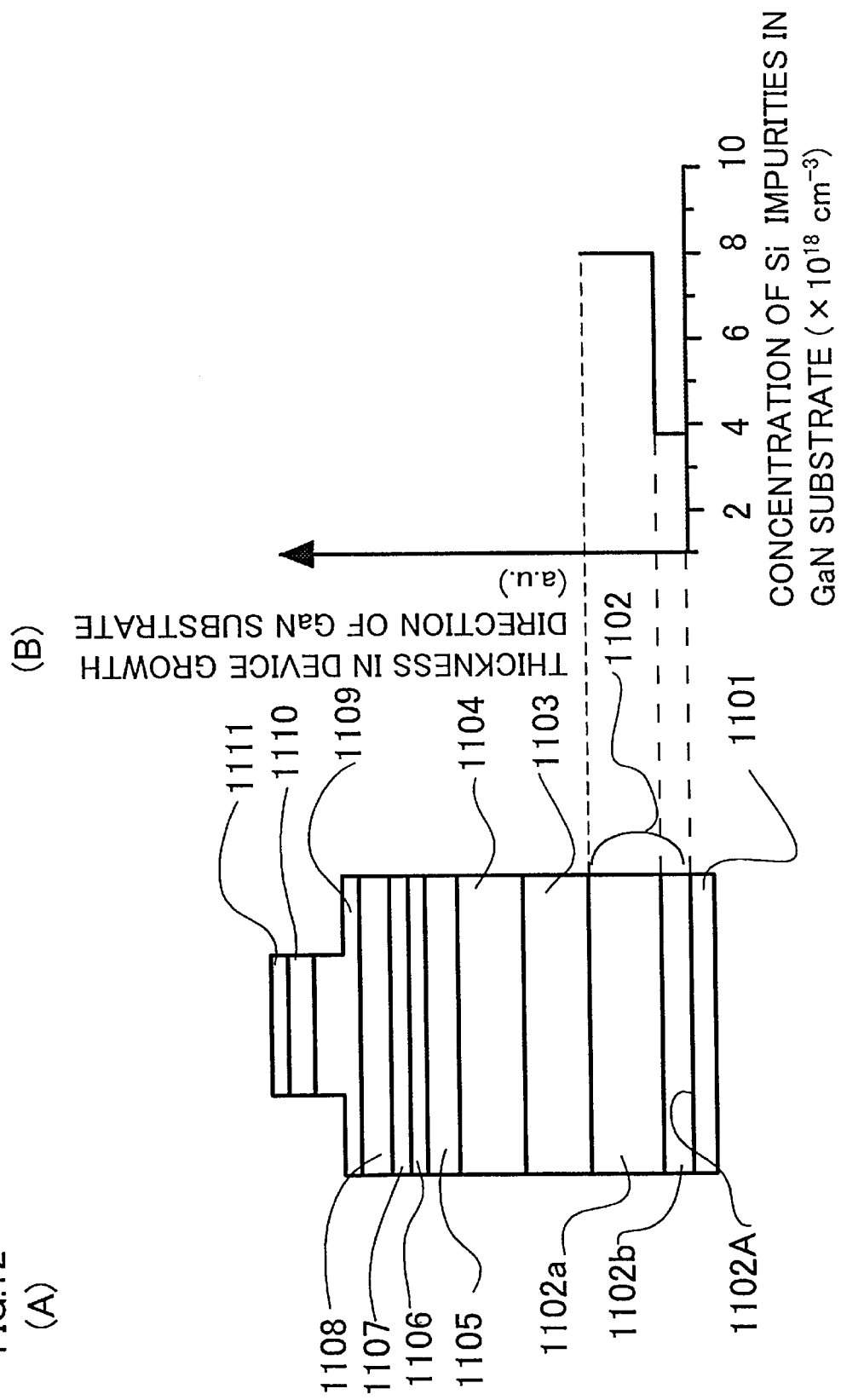
FIG. 12 shows in (A) and (B) respectively a cross section of a semiconductor laser fabricated in comparative example 2 and an impurity concentration profile in the thickness direction of the substrate of the laser.

An Si-highly-doped layer was formed at the side of the Ga-terminated surface in the GaN substrate and an n-type electrode was formed on the Ga-terminated surface. On the N-terminated surface of the GaN substrate, epitaxial growth layers for a laser device structure were formed. (A) of FIG. 12 shows a cross section of the fabricated GaN compound semiconductor laser and (B) of FIG. 12 shows an impurity concentration profile in the direction of growth (direction of thickness) of the GaN substrate. GaN substrate 1102 is composed of an Si-normally-doped GaN layer 1102B (Si impurity concentration: $3.8 \times 10^{18}$ $cm^{-3}$) and Si-highly-doped GaN layer 1102C (Si impurity concentration: 8.0× $10^{18}$ $cm^{-3}$). The laser structure is formed on Si-highly-doped GaN layer 1102C. N-type electrode 1101 is formed on Ga-terminated surface 1102A of Si-normally-doped GaN layer 1102B. A process of fabrication is as follows.

Similarly to example 1, an undoped GaN film by MOCVD and an $SiO_2$ film were produced. The sapphire substrate having the undoped GaN underlayer and the stripe-shaped growth inhibiting film grown thereon was placed into an H-VPE system. $N_2$ carrier gas and $NH_3$ were flown each at 5 L/min while the substrate was heated to 1050° C. GaCl was then supplied onto the substrate at 100 cc/min to start growth of a thick GaN film. GaCl was generated by flowing HCl gas to Ga metal kept at 850° C. Further, an impurity gas was supplied by using an impurity doping line extended separately to the neighborhood of the substrate for optional doping during the growth.

The growth was started with Si-doping and monosilane ($SiH_4$) was supplied at 200 nmol/min for approximately three hours to grow Si-normally-doped GaN layer 1102B (Si impurity concentration: $3.8 \times 10^{18}$ $cm^{-3}$) to 345 $\mu$m. The flow rate of $SiH_4$ was then changed to 500 nmol/min to grow Si-highly-doped GaN layer 1102C (Si impurity concentration: $8.0 \times 10^{18}$ $cm^{-3}$) for 3 minutes (to a thickness of approximately 5 $\mu$m), resulting in a thick GaN film of approximately 350 $\mu$m in thickness. The outermost surface of the GaN obtained under these growth conditions was the Ga-terminated surface.

After the growth, the sapphire substrate, the undoped GaN film produced by the MOCVD and the $SiO_2$ film were removed by polishing, and the polishing was done until the N-terminated surface appeared to produce GaN substrate 1102. The thick GaN film obtained in this manner was used as a substrate, and epitaxial growth on the N-terminated surface by MOCVD gave a light-emitting device structure. Similarly to example 1, an n-type GaN layer 1103, an n-type $Al_{0.1}Ga_{0.9}N$ cladding layer 1104, an n-type GaN light guiding layer 1105, a light-emitting layer 1106 of multiple quantum wells, a p-type $Al_{0.2}Ga_{0.8}N$ carrier blocking layer 1107, a p-type GaN light guiding layer 1108, a p-type $Al_{0.1}Ga_{0.9}N$ cladding layer 1109, a p-type GaN contact layer 1110, and a p-type electrode 1111 were formed, and n-type electrode 1101 was fabricated on Ga-terminated surface 1102A, resulting in the laser device.

The fabricated laser did not generate continuous emission at room temperature.

On the N-terminated surface and the Ga-terminated surface of the produced GaN substrate respectively, n-type electrodes of Ti/Al were formed and their characteristics were examined. It was found that the n-type electrode on the N-terminated surface exhibited favorable ohmic characteristics while the n-type electrode on the Ga-terminated surface exhibited Schottky characteristics suggesting the presence of a barrier layer.

Both of the n-type electrode (101 in (A) of FIG. 1) on the N-terminated surface of the Si-normally-doped layer and the n-type electrode (1001 in (A) of FIG. 11) on the N-terminated surface of the Si-highly-doped layer had favorable ohmic characteristics, exhibiting superior electrode characteristics. The specific contact resistance of n-type electrode 101 was approximately $3 \times 10^{-6}$ $\Omega \cdot cm^2$ while that of n-type electrode 1001 was $9 \times 10^{-7}$ $\Omega \cdot cm^2$. An n-type electrode formed on the N-terminated surface of the Si-highly-doped layer is thus more preferable because of its lower specific contact resistance.

Instead of the undoped GaN film formed by the MOCVD, an Si-highly-doped layer of approximately $8 \times 10^{18}$ $cm^{-3}$ in impurity concentration was formed, and then a GaN film of $2 \times 10^{18}$ cm$^{-3}$ in impurity concentration was formed on the Si-highly-doped layer. Polishing was then carried out until the N-terminated surface of the GaN appeared, and an n-type electrode was fabricated on the N-terminated surface of the Si-highly-doped GaN layer. A laser device produced by this process also had a threshold voltage of approximately 5 V and a threshold current density of 1.1 kA/cm$^2$. It is considered that an electrode of superior characteristics can be formed on a highly-doped region having relatively more defects such as dislocation.

EXAMPLE 4

Lasers were fabricated by using different GaN substrates with the amount of impurities varied in the direction of the thickness. Respective cross sections of the GaN substrates having varied impurity concentrations in this example are shown in (A) of FIGS. 13 to 18 respectively, and respective profiles of the impurity concentration in the direction of the thickness of the respective GaN substrates are shown in (B) of FIGS. 13 to 18.

Figure 13:
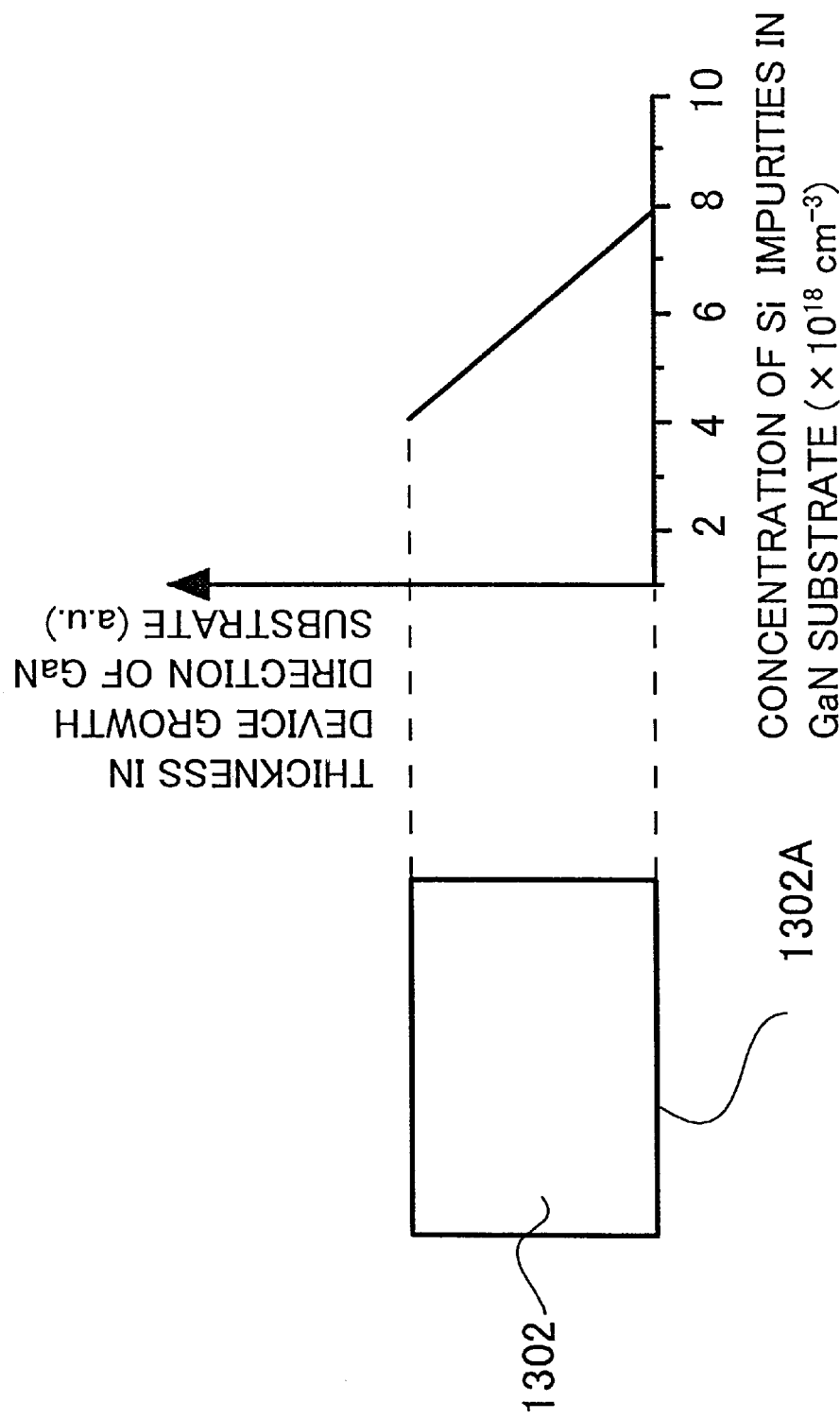
FIG. 13 shows in (A) and (B) respectively a schematic cross section of a GaN substrate used in example 4 and an impurity concentration profile in the substrate.

(A) of FIG. 13 shows a GaN substrate 1302, wherein the impurity concentration decreases in the direction of growth of the device (in the direction of the thickness, and an N-terminated surface 1302A. An n-type electrode (not shown) is in contact with the N-terminated surface. As shown in (B) of FIG. 13, the impurity concentration in substrate 1302 linearly decreases from the N-terminated surface toward the epitaxial growth surface for the laser.

Figure 14:
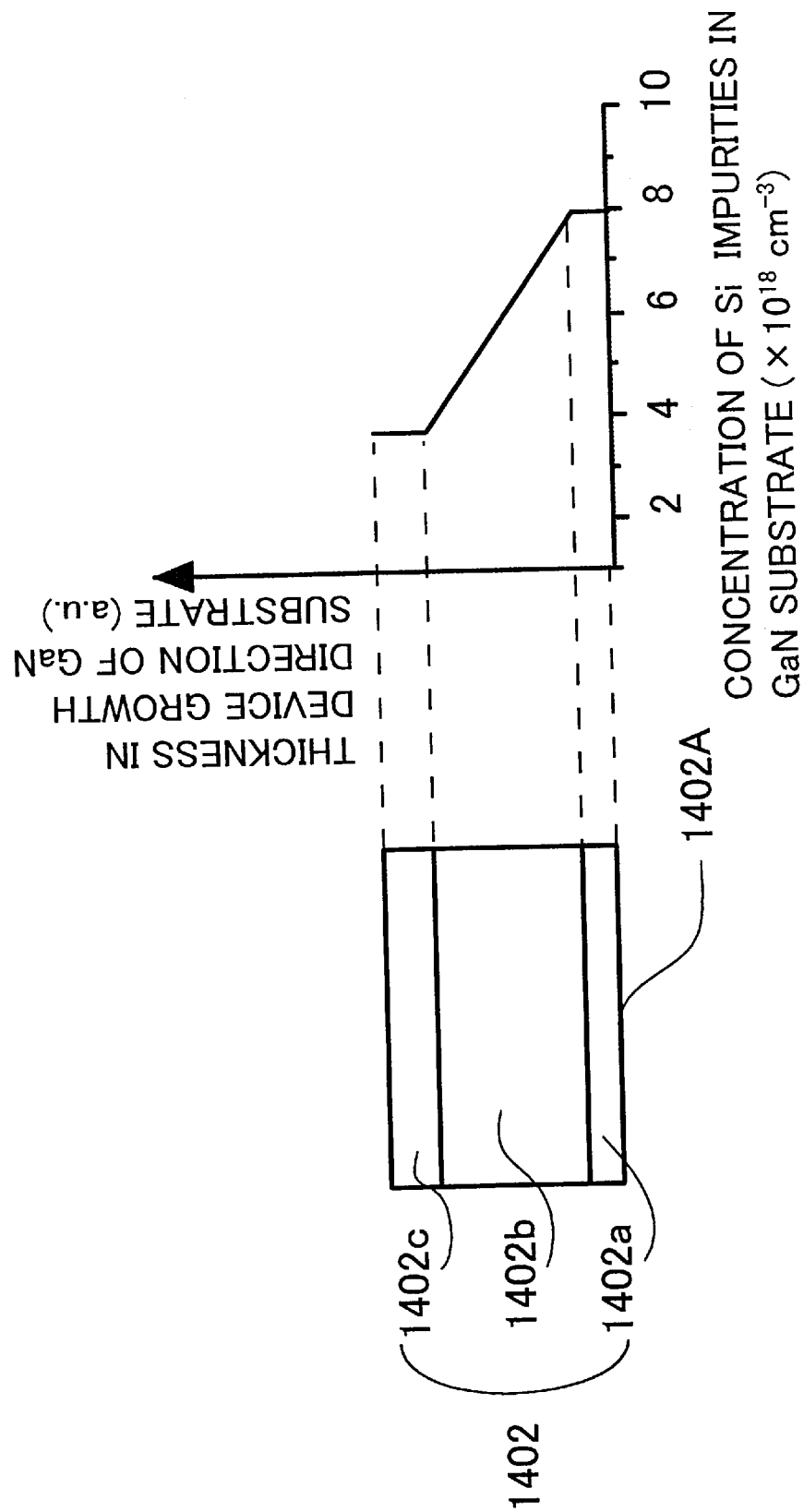
FIG. 14 shows in (A) and (B) respectively a schematic cross section of another GaN substrate used in example 4 and an impurity concentration profile in the substrate.

As shown in (A) and (B) of FIG. 14, a GaN substrate 1402 has a first GaN layer 1402B having the highest and constant impurity concentration, a second GaN layer 1402C having its impurity concentration linearly decreasing in the direction of device growth (direction of the thickness), and a third GaN layer 1402D having the lowest and constant impurity concentration. An N-terminated surface 1402A is in contact with an n-type electrode (not shown).

Figure 15:
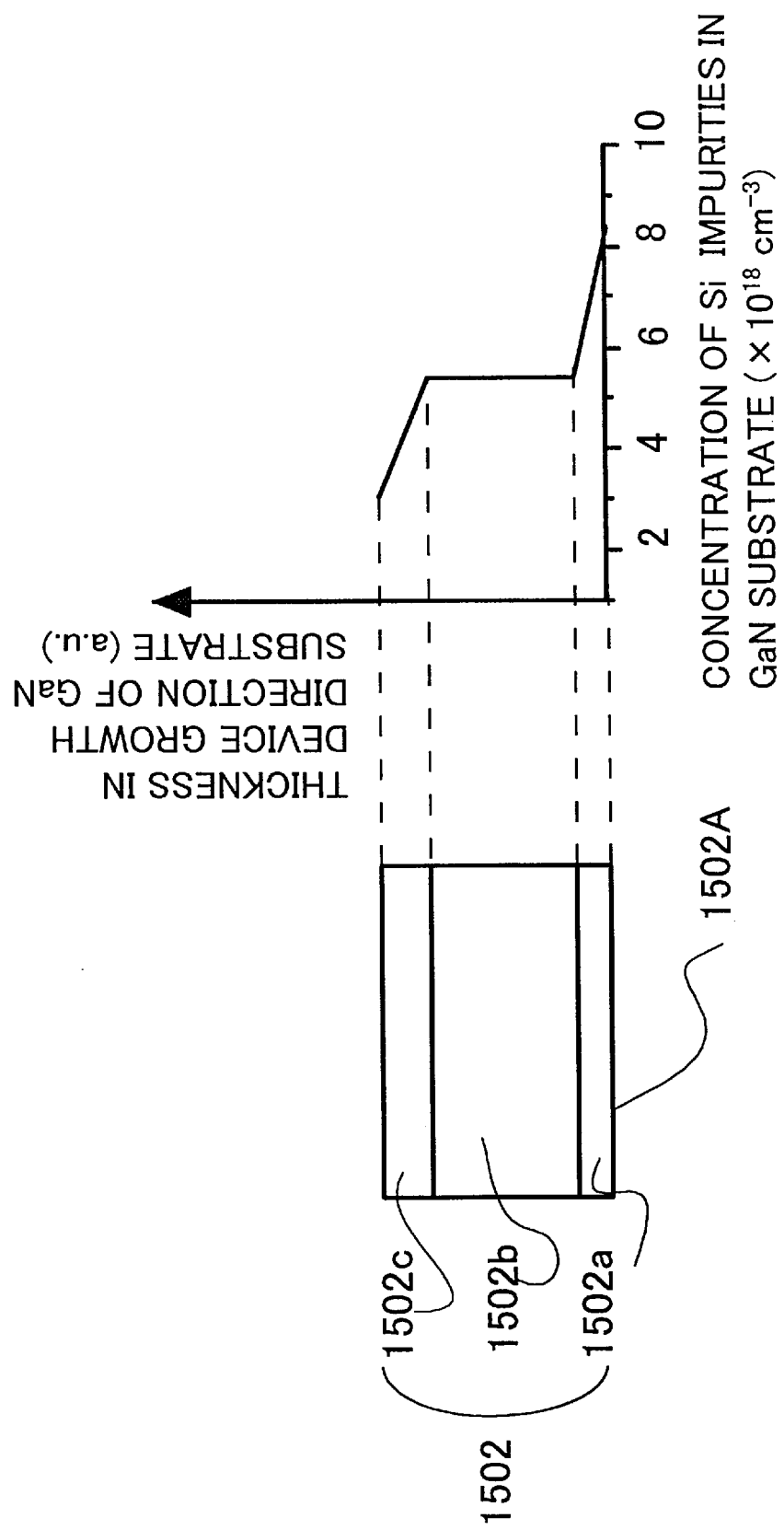
FIG. 15 shows in (A) and (B) respectively a schematic cross section of still another GaN substrate used in example 4 and an impurity concentration profile in the substrate.

As shown in (A) and (B) of FIG. 15, a GaN substrate 1502 has a first GaN layer 1502B having its impurity concentration decreasing linearly from the maximum in the direction of the thickness, a second GaN layer 1502C having a constant impurity concentration, and a third GaN layer 1502D having its impurity concentration decreasing to the minimum linearly in the direction of the thickness. An N-terminated surface 1502A is in contact with an n-type electrode (not shown).

Figure 16:
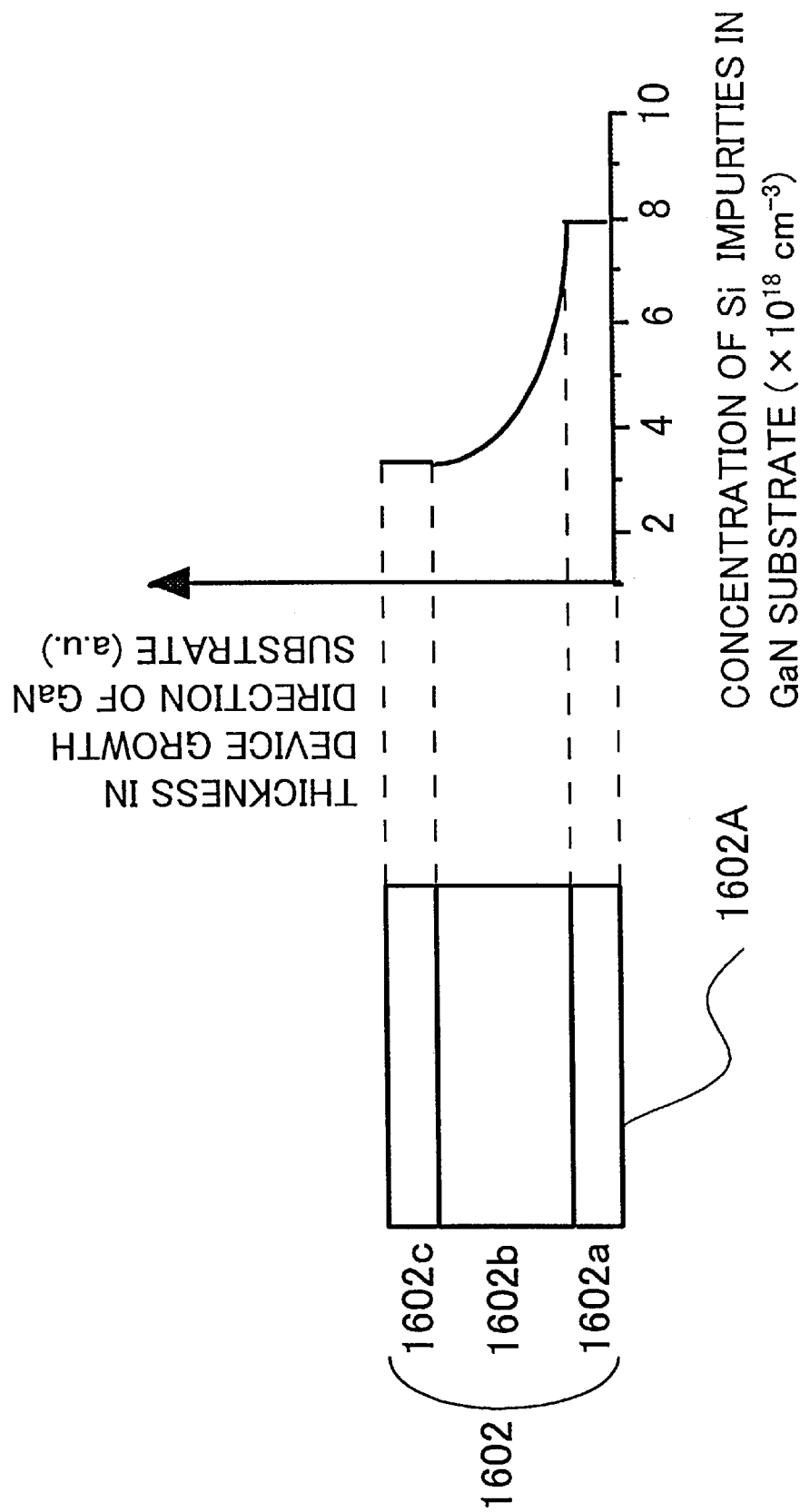
FIG. 16 shows in (A) and (B) respectively a schematic cross section of a further GaN substrate used in example 4 and an impurity concentration profile in the substrate.

As shown in (A) and (B) of FIG. 16, a GaN substrate 1602 has a first GaN layer 1602B having the highest and constant impurity concentration, a second GaN layer 1602C having its impurity concentration decreasing in the direction of thickness, and a third GaN layer 1602D having the lowest and constant impurity concentration. An N-terminated surface 1602A is in contact with an n-type electrode (not shown).

Figure 17:
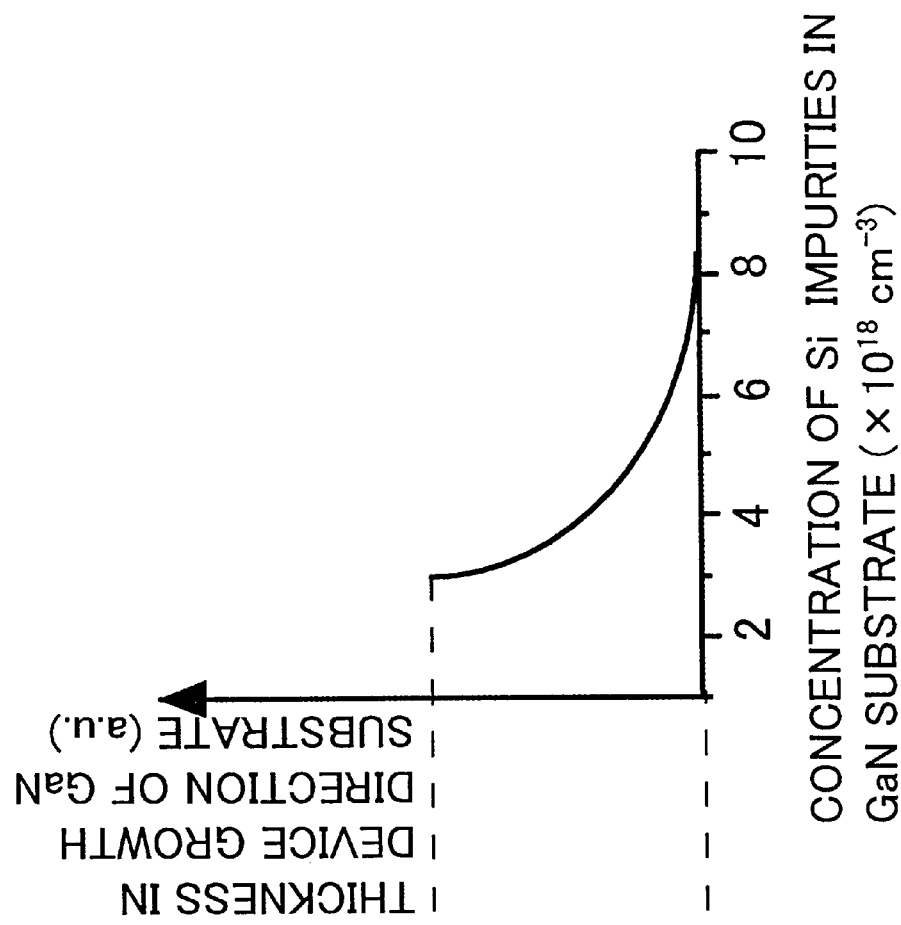
FIG. 17 shows in (A) and (B) respectively a schematic cross section of a further GaN substrate used in example 4 and an impurity concentration profile in the substrate.

As shown in (A) and (B) of FIG. 17, a GaN substrate 1702 has its impurity concentration decreasing in the direction of the thickness. An n-type electrode (not shown) is in contact with an N-terminated surface 1702A.

Figure 18:
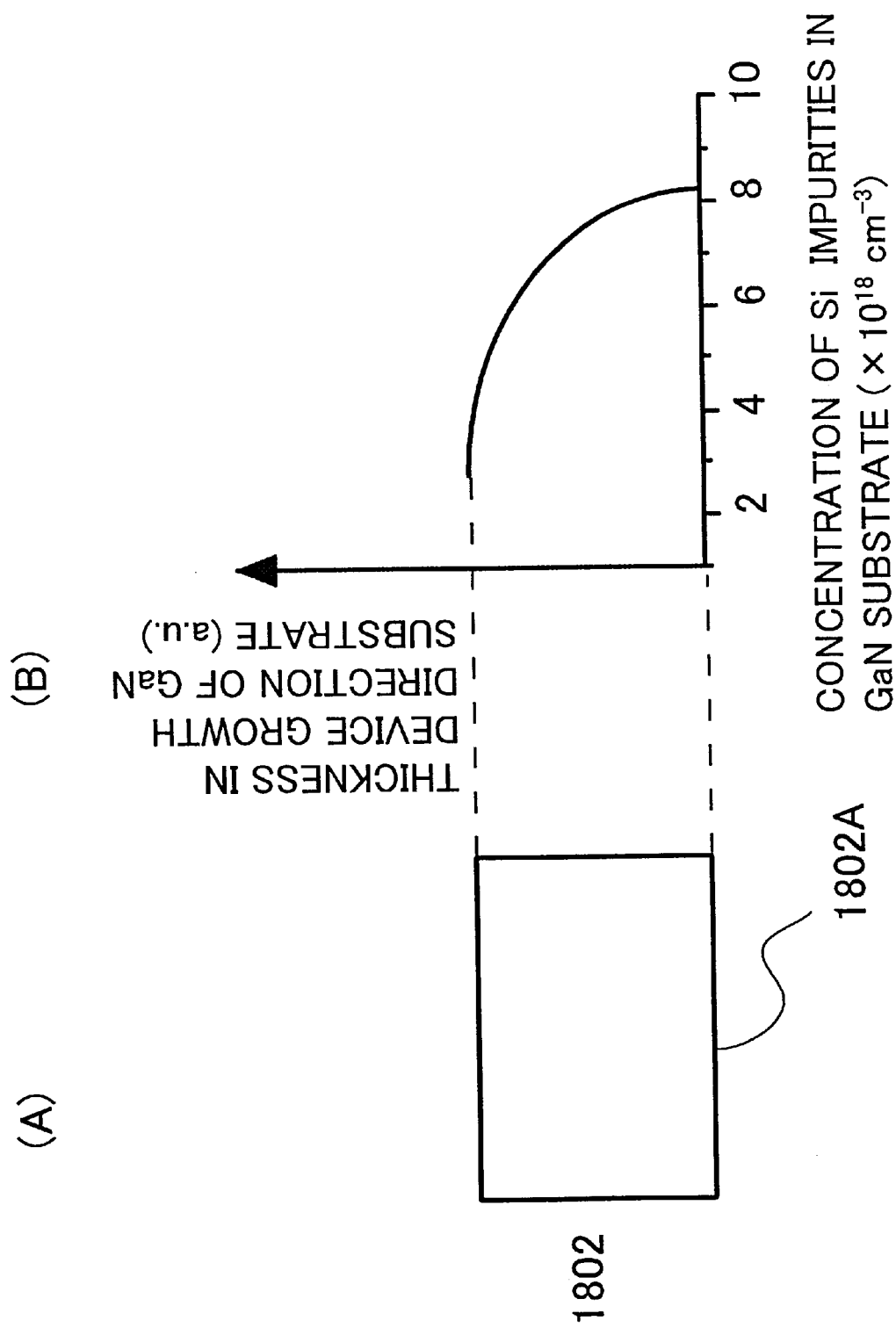
FIG. 18 shows in (A) and (B) respectively a schematic cross section of a further GaN substrate used in example 4 and an impurity concentration profile in the substrate.

As shown in (A) and (B) of FIG. 18, a GaN substrate 1802 has its impurity concentration decreasing in the direction of the thickness. An n-type electrode (not shown) is in contact with an N-terminated surface 1802A.

Using respective GaN substrates having respective impurity profiles as shown in (B) of FIGS. 13 to 18, laser devices were fabricated in a similar manner to that of example 1. The obtained lasers had superior characteristics, and the characteristics were highly dependent on the impurity concentration in the vicinity of the n-type electrode as shown in FIG. 7. Favorable laser characteristics were also achieved in this example by forming an n-type electrode on the N-terminated surface where N atom comprised at least 60% of the terminator atoms present on the surface.

EXAMPLE 5

In this example, a plurality of regions having different impurity concentrations were provided in the GaN substrate.

Figure 19:
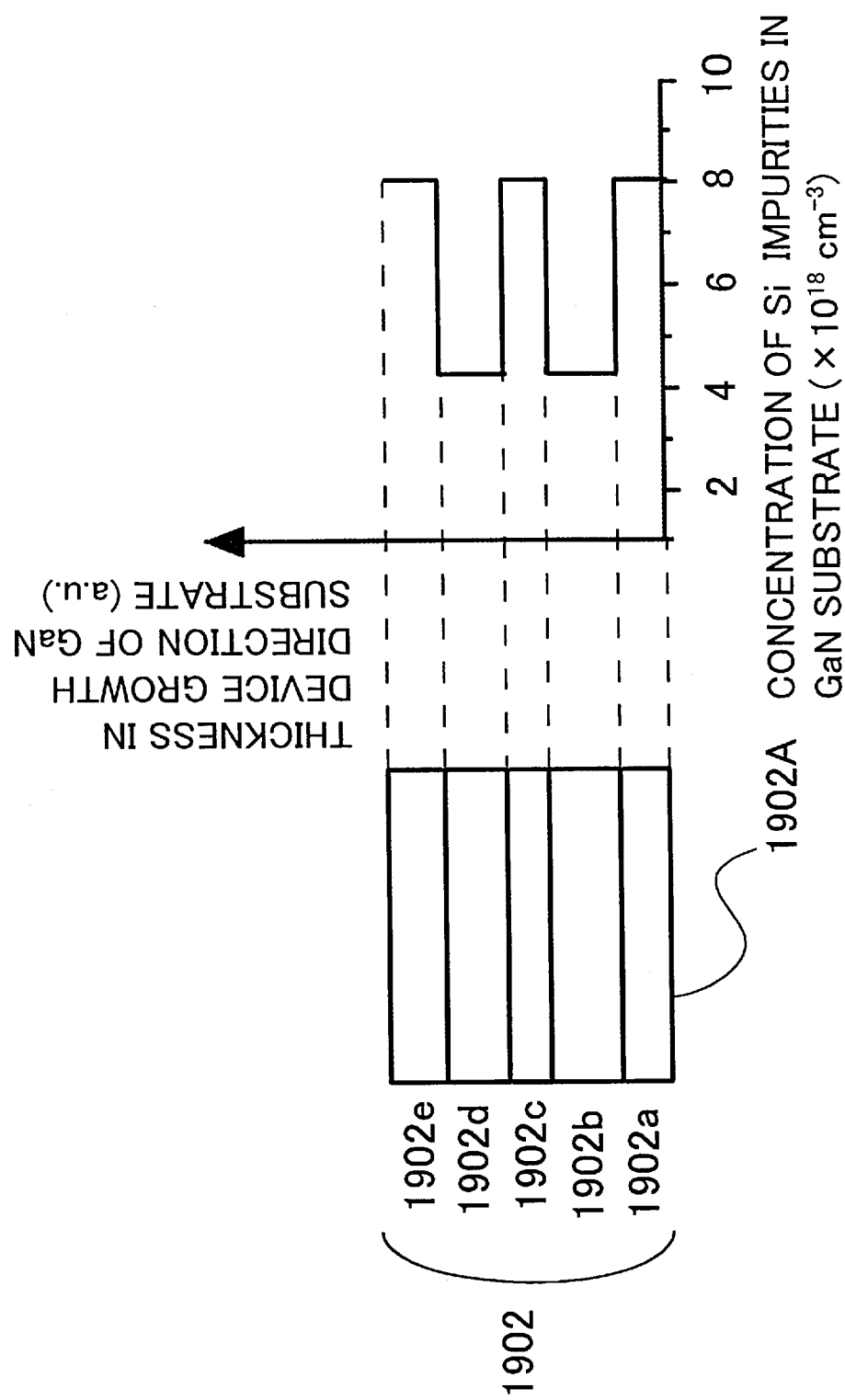
FIG. 19 shows in (A) and (B) respectively a schematic cross section of a GaN substrate used in example 5 and an impurity concentration profile in the substrate.

The GaN substrate as shown in (A) of FIG. 19 was used. Substrate 1902 had an impurity concentration profile as shown in (B) of FIG. 19. GaN substrate 1902 having an N-terminated surface 1902A was composed of an Si-highly-doped layer 1902B having a thickness of approximately 5 μm (Si impurity concentration: $8.0 \times 10^{18}$ cm$^{-3}$), an Si-doped layer 1902C (Si impurity concentration: $4.2 \times 10^{18}$ cm$^{-3}$), an Si-highly-doped layer 1902D (Si impurity concentration: $8.0 \times 10^{18}$ cm$^{-3}$), an Si-doped layer 1902E (Si impurity concentration: $4.2 \times 10^{18}$ cm$^{-3}$) and an Si-highly-doped layer 1902F (Si impurity concentration: $8.0 \times 10^{18}$ cm$^{-3}$).

The GaN substrate was prepared by H-VPE to have high-impurity regions at two or more sites which include the site of the N-terminated surface (Si-highly-doped layer 1902B) to be in contact with an n-type electrode and the site of the Ga-terminated surface (Si-highly-doped layer 1902F). In each layer of the GaN substrate, the Si concentration was made constant. Epitaxial growth on the Ga-terminated surface accomplished in a similar manner to that of example 3 produced an n-type GaN layer, an n-type Al$_{0.1}$Ga$_{0.9}$N cladding layer, an n-type light guiding layer, a light-emitting layer of multiple quantum wells, a p-type Al$_{0.2}$Ga$_{0.8}$N carrier blocking layer, a p-type GaN light guiding layer, a p-type Al$_{0.1}$Ga$_{0.9}$N cladding layer, a p-type GaN contact layer, and a p-type electrode, and an n-type electrode was fabricated on the N-terminated surface, resulting in a semiconductor device. The fabricated laser had a threshold voltage of approximately 5V, and a threshold current density of approximately 1 kA/cm$^2$, exhibiting a long life characteristic.

N-type electrodes of Ti/Al were formed respectively on the N-terminated surface and the Ga-terminated surface of the prepared GaN substrate. The n-type electrode on the N-terminated surface exhibited favorable ohmic characteristics while the n-type electrode on the Ga-terminated surface exhibited Schottky characteristics suggesting the presence of a barrier layer.

Figure 20:
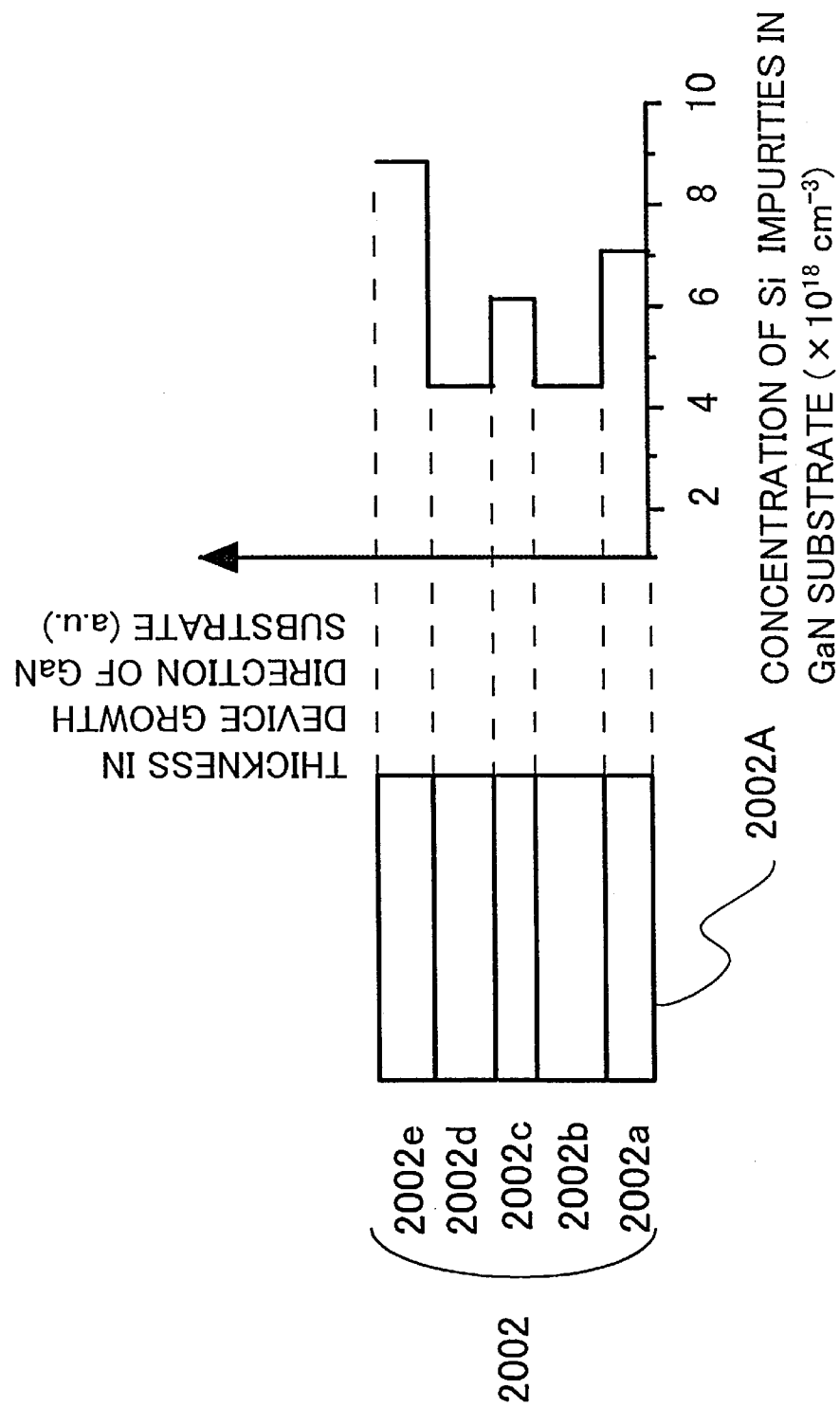
FIG. 20 shows in (A) and (B) respectively a schematic cross section of another GaN substrate used in example 5 and an impurity concentration profile in the substrate.
Figure 21:
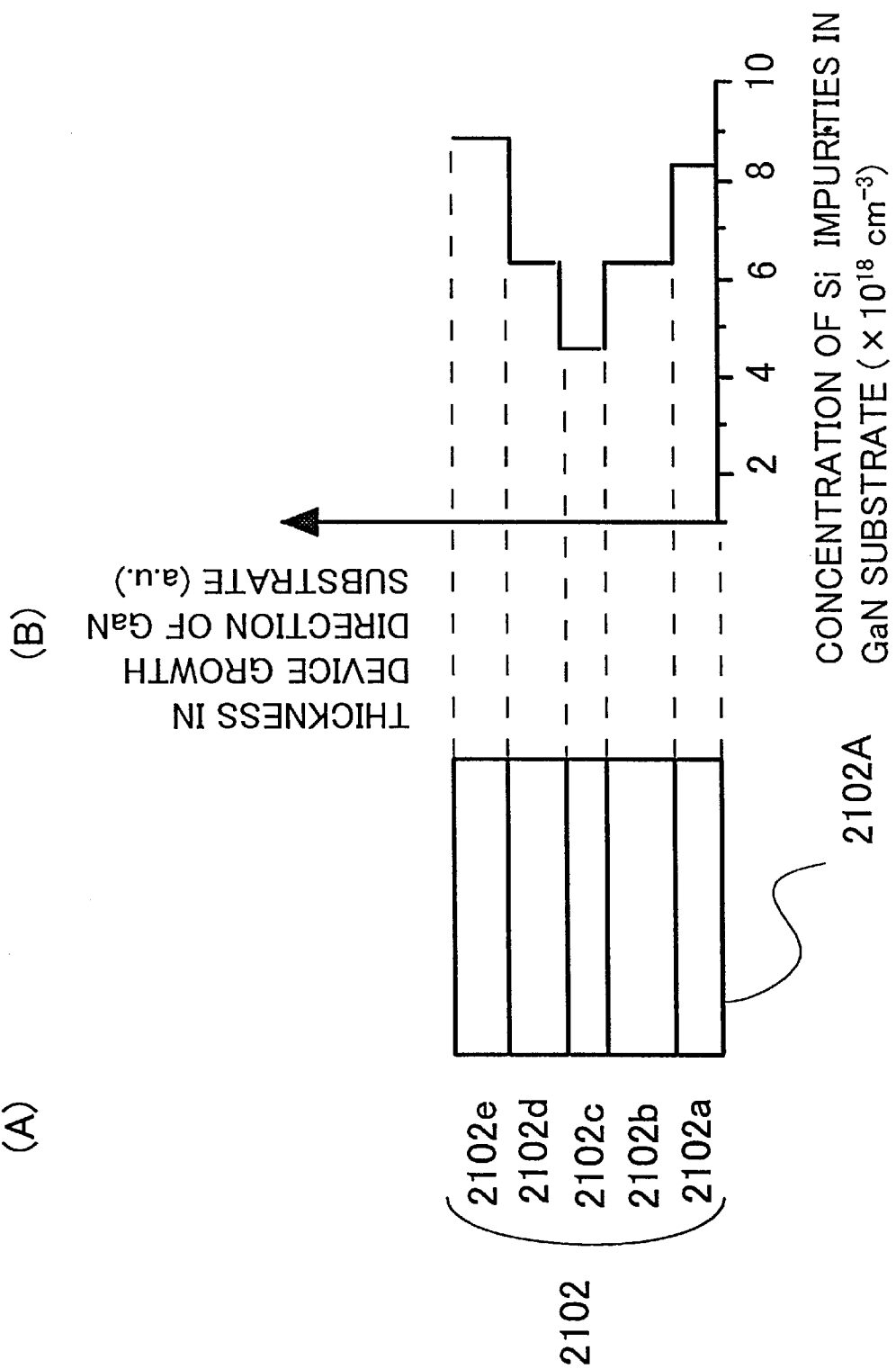
FIG. 21 shows in (A) and (B) respectively a schematic cross section of still another GaN substrate used in example 5 and an impurity concentration profile in the substrate.
Figure 22:
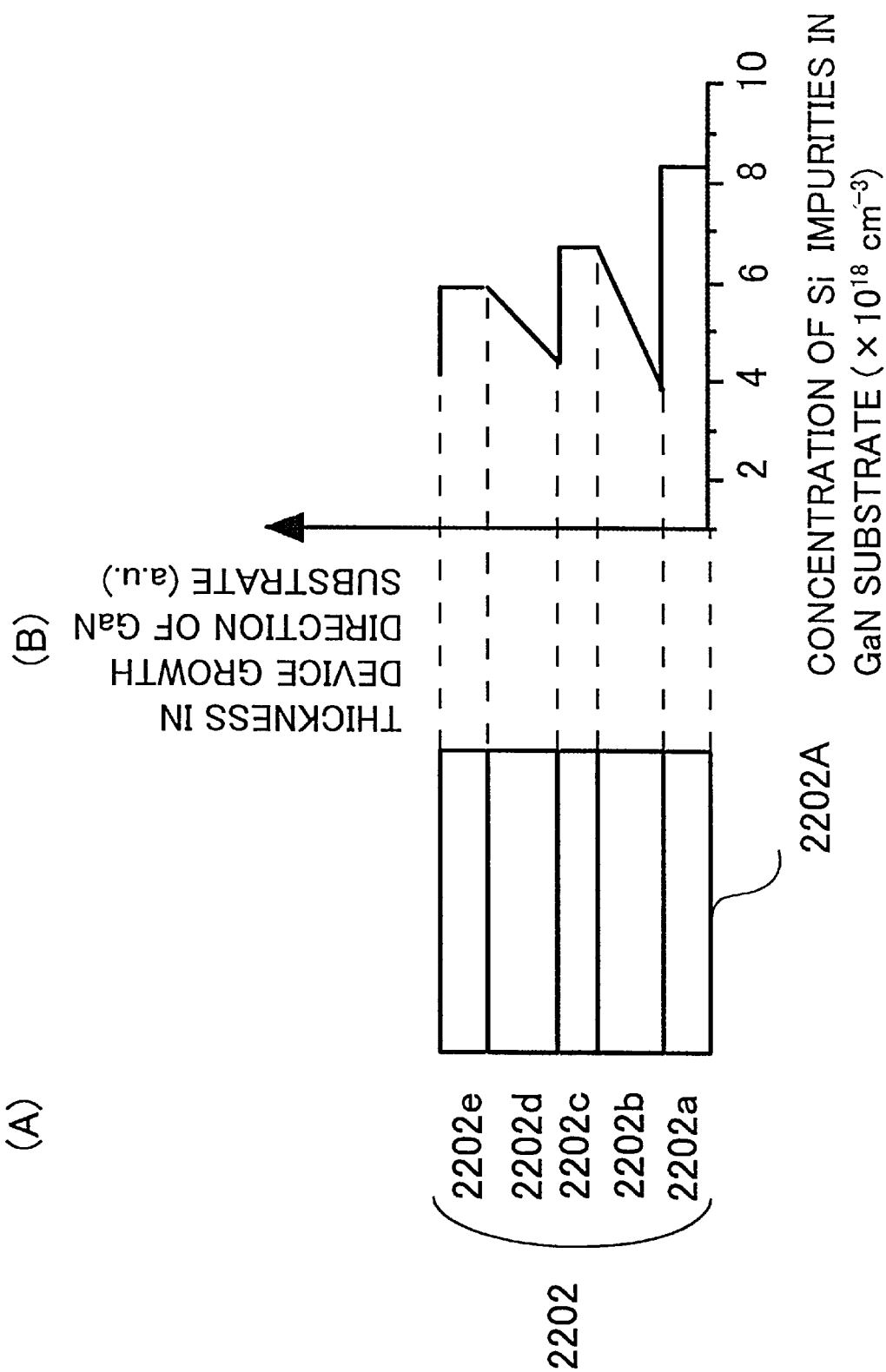
FIG. 22 shows in (A) and (B) respectively a schematic cross section of a further GaN substrate used in example 5 and an impurity concentration profile in the substrate.
Figure 23:
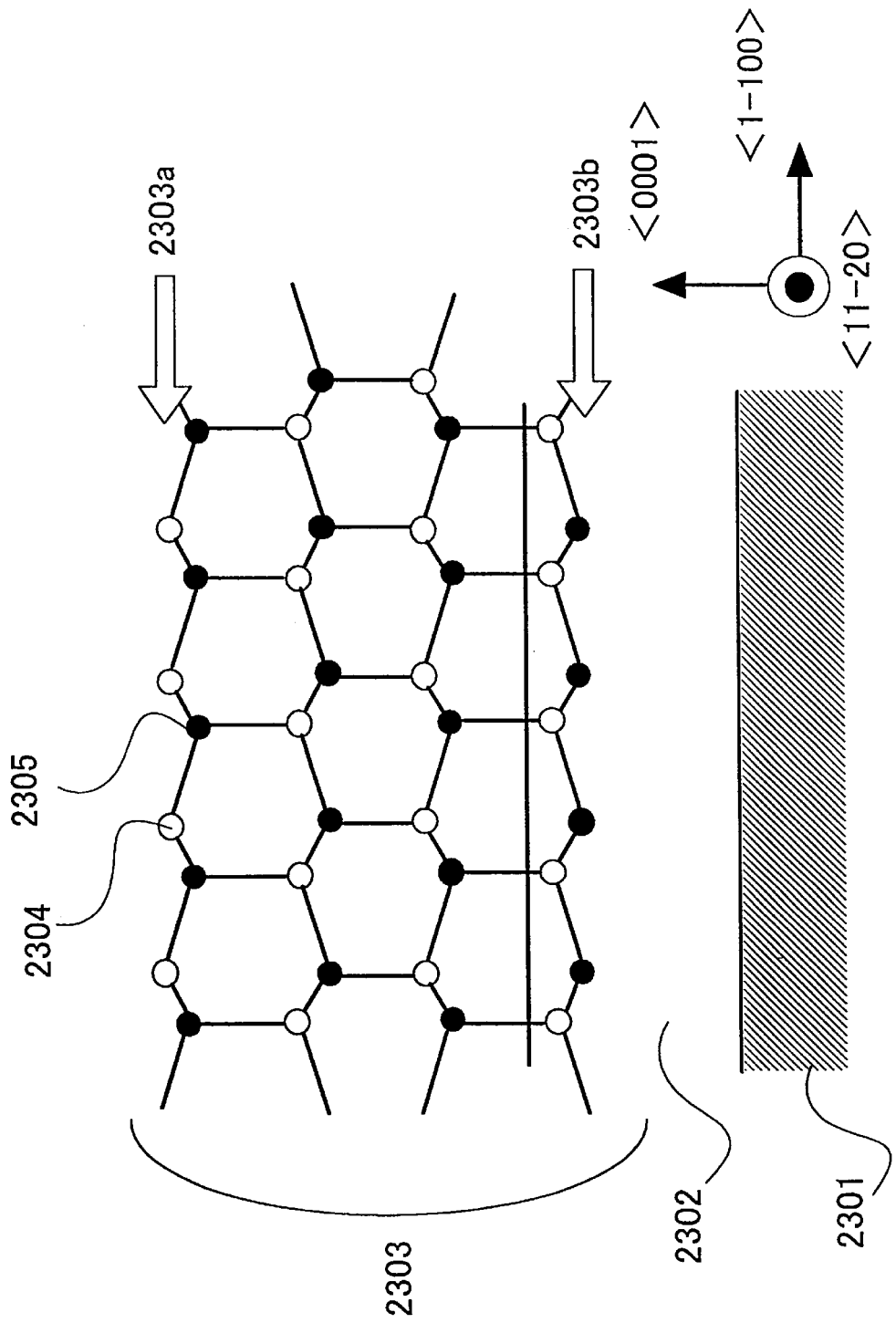
FIG. 23 diagrammatically shows a Ga-terminated surface and an N-terminated surface of GaN formed on the (0001) plane of a seed substrate.

GaN substrates shown respectively in (A) of FIGS. 20 to 22 were used to produce semiconductor lasers. Respective impurity concentration profiles in the direction of the thickness of the respective GaN substrates are shown in (B) of FIGS. 20 to 22.

GaN substrate 2002 shown in (A) of FIG. 20 was composed of a first GaN layer 2002B having a constant impurity concentration, a second GaN layer 2002C having a constant impurity concentration lower than that of the first GaN layer 2002B, a third GaN layer 2002D having a constant impurity concentration higher than that of the second GaN layer 2002C, a fourth GaN layer 2002E having a constant impurity concentration lower than that of the third GaN layer 2002D, and a fifth GaN layer 2002F having a constant impurity concentration higher than that of the fourth GaN layer 2002E. The first GaN layer 2002B formed an N-terminated surface 2002A. Those layers had a relation regarding the values of the respective impurity concentrations as represented by formula 1:

fifth GaN layer 2002F>first GaN layer 2002B>third GaN layer 2002D>second GaN layer 2002C=fourth GaN layer 2002E GaN substrate 2102 shown in (A) of FIG. 21 was composed of a first GaN layer 2102B having a constant impurity concentration, a second GaN layer 2102C having a constant impurity concentration, a third GaN layer 2102D having a constant impurity concentration, a fourth GaN layer 2102E having a constant impurity concentration, and a fifth GaN layer 2102F having a constant impurity concentration. The first GaN layer 2102B formed an N-terminated surface 2102A. Those layers had a relation regarding the values of the respective impurity concentrations as represented by formula 2:

fifth GaN layer 2102F>first GaN layer 2102B>second GaN layer 2102C=fourth GaN layer 2102E>third GaN layer 2102D GaN substrate 2202 shown in (A) of FIG. 22 was composed of a first GaN layer 2202B having a constant impurity concentration, a second GaN layer 2202C having an impurity concentration increased in the direction of device growth (direction of the thickness), a third GaN layer 2202D having a constant impurity concentration, a fourth GaN layer 2202E having an impurity concentration increased in the direction of device growth (direction of the thickness), and a fifth GaN layer 2202F having a constant impurity concentration. The first GaN layer 2202B formed an N-terminated surface 2202A. Those layers had a relation regarding the values of the respective impurity concentrations as represented by formula 3:

first GaN layer 2202B>third GaN layer 2002D>fifth GaN layer 2202F

Using the GaN substrates having the respective impurity concentration profiles shown in (B) of FIGS. 20 to 22, laser devices were fabricated in a similar manner to that of example 1. The fabricated laser devices exhibited superior characteristics. The substrates used in this example each had three Si-highly-doped layers. If a substrate has Si-highly-doped layers on both sides of the substrate, almost the same effects as those of this example can be achieved. The number of Si-highly-doped layers may be two, four or more. The portion forming the N-terminated surface in contact with the n-type electrode preferably has an n-type impurity concentration higher than those of other portions, but should not necessarily have the highest concentration. For preferable characteristics, the substrate may include at least one portion having an impurity concentration lower than that of the portion forming the N-terminated surface. A laser device having superior characteristics can be obtained by forming an n-type electrode on an N-terminated surface having a properly high impurity concentration.

EXAMPLE 6

In this example, a GaN substrate exhibiting n-type conduction characteristics was grown by using Ge as impurities in a portion constituting an N-terminated surface of the GaN substrate.

The growth of a thick GaN film by H-VPE was started, similarly to example 1, and simultaneously predetermined amounts of $SiH_4$ and germanium (Ge) were supplied to give a thick n-type GaN film of 350 $\mu$m in total thickness having a certain impurity concentration profile. After the growth, polishing was done to eliminate the sapphire substrate, the undoped GaN film produced by the MOCVD and the $SiO_2$ film, and the polishing was continued until an N-terminated surface was exposed to produce a GaN substrate. Using this GaN substrate, a laser structure and a p-type electrode were fabricated on the Ga-terminated surface and an n-type electrode was fabricated on the N-terminated surface in a similar manner to that of example 1 to give a laser. The obtained laser generated continuous emission at room temperature. The threshold voltage and the threshold current density were approximately 6 V and 1.8 kA/cm² respectively.

Comparative Example 3

Similarly to example 6, a thick GaN film was grown by H-VPE. During the growth of the thick GaN film, predetermined amounts of $SiH_4$ and germanium (Ge) were supplied to prepare a thick n-type GaN film of 350 $\mu$m in total thickness having a certain impurity concentration profile. The thick film was formed to have a highly Si- and Ge-doped layer at the side of the Ga-terminated surface. Polishing was carried out similarly to example 6 to produce a GaN substrate. An n-type electrode was formed on the Ga-terminated surface of the obtained GaN substrate and a device structure was epitaxially grown on the N-terminated surface of the GaN substrate to give a laser. Continuous laser emission was not observed on the obtained laser structure at room temperature. It was considered that the presence of a barrier layer might cause Schottky characteristics of the electrode as discussed in comparative example 1.

EXAMPLE 7

Similarly to example 3, the impurity concentration was varied. The growth of a thick GaN film was started by H-VPE, and simultaneously a certain amount of $SiH_4$ was supplied and Ge was further supplied after 3 minutes from the start of growth. After formation of a first region having a high impurity concentration and containing Si and Ge, the supply of Ge was stopped and only a certain amount of $SiH_4$ was supplied to form a second region having an impurity concentration lower than that of the first region. In this way, a thick n-type GaN film of 350 $\mu$m in total thickness having a certain impurity concentration profile was produced. A GaN substrate was produced through polishing and placed into an MOCVD system. Similarly to example 3, epitaxial growth on the Ga-terminated surface and formation of an n-type electrode on the N-terminated surface gave a laser device. The relation of the first and second regions of the GaN substrate regarding the impurity concentration was represented by, first region>second region.

The obtained laser device had such low threshold voltage and threshold current density as approximately 5 V and 1.0 kA/cm². It is understood that not only Si but Ge can be employed as n-type impurities. O can also be used as the n-type impurities and its actual effect has been confirmed. Specifically, O can be supplied into the film by adjusting the amount of O contained in HCl gas or supplying oxygen gas during the growth of the GaN.

EXAMPLE 8

Figure 24:
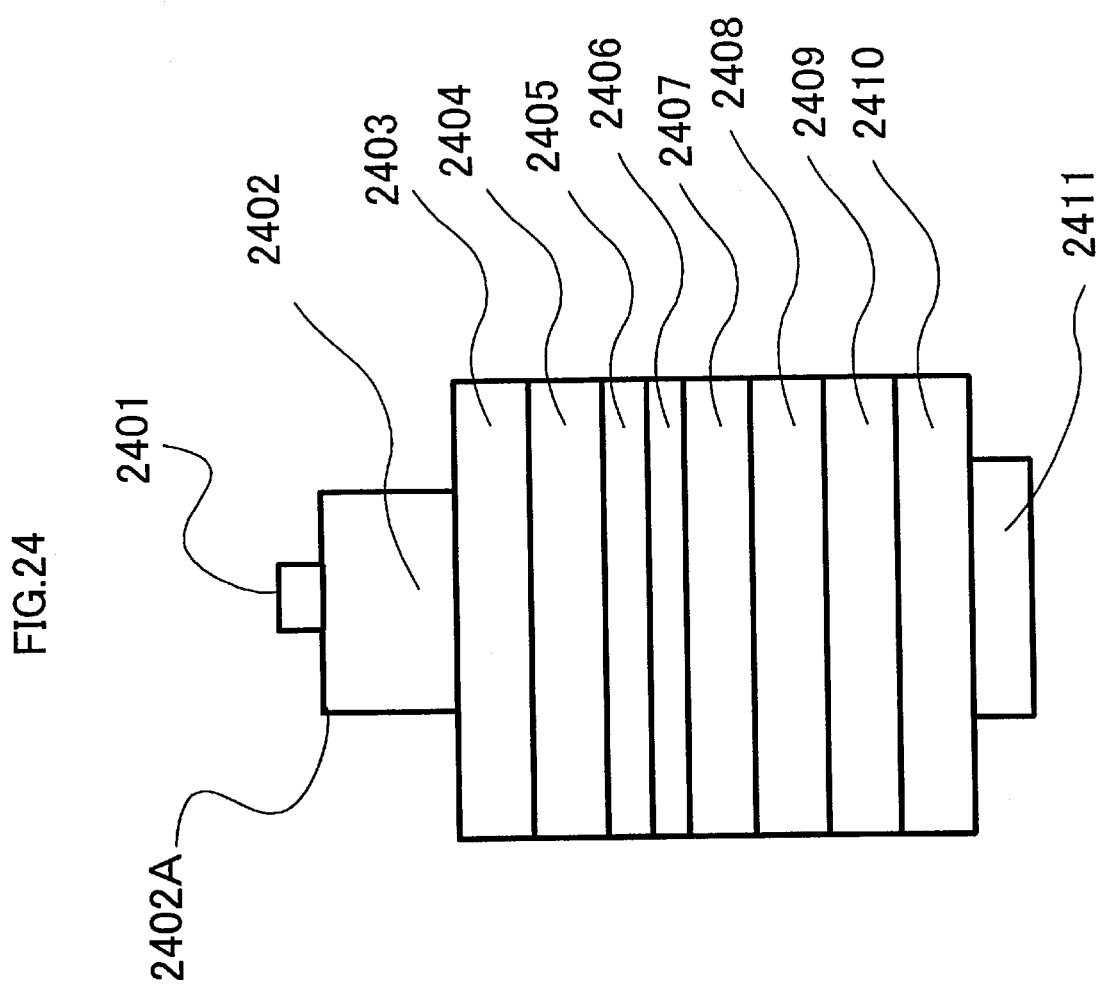
FIG. 24 is a schematic cross section of a laser device fabricated in example 8.

In this example, the GaN grown surface was changed to an N-terminated surface by molecular beam epitaxy (MBE), and an n-type electrode was formed thereon. FIG. 24 shows a structure of a laser device according to this example. On one major surface 2402A of a GaN substrate 2402, a p-type electrode 2401 was formed. Major surface 2402A being in contact with p-type electrode 2401 was a Ga-terminated surface. On the other major surface of GaN substrate 2402, a p-type GaN layer 2403, a p-type $Al_{0.1}Ga_{0.9}N$ cladding layer 2404, a p-type GaN light guiding layer 2405, a light-emitting layer 2406 of multiple quantum wells, an n-type $Al_{0.2}Ga_{0.8}N$ carrier blocking layer 2407, an n-type GaN light guiding layer 2408, an n-type $Al_{0.1}Ga_{0.9}N$ cladding layer 2409, an n-type GaN contact layer 2410, and an n-type electrode 2411 were formed in this order. N-type GaN contact layer 2410 which was the uppermost layer of the GaN compound semiconductor layers had an N-terminated surface 2410A on which n-type electrode 2411 was formed. A process of fabricating this semiconductor laser is now described.

Similarly to example 1, on a cleaned (0001) surface of a sapphire substrate, an undoped GaN film of 3 $\mu$m in thickness was grown by MOCVD, and a stripe-shaped growth inhibiting film was formed thereon. Then, the sapphire substrate having the undoped GaN underlayer film covered partially with the stripe-shaped growth inhibiting film was placed into an H-VPE system. $N_2$ carrier gas and $NH_3$ were supplied each at 5 L/min while the substrate was heated to approximately 1050° C. Then GaCl was supplied onto the substrate at 100 cc/min to start growth of a thick GaN film. The GaCl was generated by flowing HCl gas to Ga metal kept at 850° C. During the growth, doping was optionally possible by supplying an impurity gas through an impurity doping line separately extended to the neighborhood of the substrate. Simultaneously with the start of the GaN growth, $Cp_2Mg$ was supplied at 90 nmol/min to obtain an Mg-doped GaN layer (Mg impurity concentration: $9.5 \times 10^{18}$ cm$^{-3}$). In this way, a thick GaN film of 350 $\mu$m in thickness was produced through the total growth for 3 hours. The outermost surface of the GaN produced under these growth conditions was a Ga-terminated surface.

After the growth, the sapphire substrate, the undoped GaN film obtained by the MOCVD and the $SiO_2$ film were removed by polishing, and the polishing was continued until an N-terminated surface was exposed to obtain a GaN substrate. On the obtained substrate, a light-emitting devise structure was grown by MOCVD. First, the substrate was placed into an MOCVD system, and $N_2$ and $NH_3$ were flown each at 5 L/min while the temperature was raised to 1050° C. At the raised temperature, the carrier gas $N_2$ was replaced with $H_2$, and TMG and $CP_2Mg$ were supplied respectively at 100 $\mu$mol/min and 10 nmol/min to grow a p-type GaN layer of 4 $\mu$m in thickness. The flow rate of the TMG was then adjusted to 50 $\mu$mol/min and TMA was supplied at 40 $\mu$mol/min to grow a p-type $Al_{0.1}Ga_{0.9}N$ cladding layer of 0.5 $\mu$m in thickness. After the growth of $Al_{0.1}Ga_{0.9}N$, supply of the TMA was stopped and the flow rate of the TMG was adjusted to 100 $\mu$mol/min to grow a p-type GaN light guiding layer of 0.1 $\mu$m in thickness. Supply of the TMG and $CP_2Mg$ was then stopped, the carrier gas was changed from $H_2$ to $N_2$ again, the temperature was lowered to 700° C., trimethylindium (TMI) as an indium source and TMG were supplied respectively at 10 $\mu$mol/min and 15 $\mu$mol/min to grow a barrier layer of 4 nm in thickness formed of $In_{0.05}Ga_{0.95}N$. Then, the supply amount of TMI was increased to 50 $\mu$mol/min to grow a well layer of 2 nm in thickness formed of $In_{0.2}Ga_{0.8}N$. Total three well layers were grown by a similar method to obtain a light-emitting layer of multiple quantum wells (MQW) in which total four barrier layers were present between the well layers and on both sides thereof. After the growth of the MQW, supply of the TMI and TMG was stopped, the temperature was raised again to 1050° C., the carrier gas was changed again from $N_2$ to $H_2$, and TMG at 50 $\mu$mol/min, TMA at 30 $\mu$mol/min and $SiH_4$ as an n-type dopant at 3 nmol/min were supplied to grow an n-type $Al_{0.2}Ga_{0.8}N$ carrier blocking layer having a thickness of 20 nm. After the growth of the carrier blocking layer, supply of the TMA was stopped and the supply amount of TMG was adjusted to 100 $\mu$mol/min to grow an n-type GaN light guiding layer of 0.1 $\mu$m in thickness. Then, the supply amount of TMG was adjusted to 50 $\mu$mol/min and TMA was supplied at 40 $\mu$mol/min to grow an n-type $Al_{0.1}Ga_{0.9}N$ cladding layer of 0.4 $\mu$m in thickness. Finally, the supply amount of TMG was adjusted to 100 $\mu$mol/min, supply of the TMA was stopped, to grow an n-type GaN contact layer of 0.1 $\mu$m in thickness. In this way, growth of the light-emitting device structure was completed. After the growth is completed, supply of the TMG and $SiH_4$ was stopped, the temperature was lowered to room temperature, and the substrate was taken out of the MOCVD system.

The GaN substrate was then placed in an MBE system to heat the substrate to 600° C. The output and flow rate of radio frequency (RF) excited $N_2$ plasma as the N source were set respectively to 350 W and 3 cc/min, and Ga cell temperature (approximately 910° C.) and Si cell temperature were adjusted to form a streaked RHEED pattern in the direction of <11-20>. The N/Ga ratio was increased to grow GaN under N-rich conditions, so that an Si-doped GaN layer having an N-terminated surface was obtained. Through RHEED observation, 1×1 pattern at 300° C. or higher was changed into 3×3 pattern at 250° C. and 6×6 pattern at 200° C., so that it was confirmed that the growth surface was the N-terminated surface. The n-type electrode was then fabricated on the resultant N-terminated surface. The GaN substrate, which had been polished until the N-terminated surface was exposed, was further polished to expose a Ga-terminated surface. On the obtained new surface, the p-type electrode was fabricated.

The laser device produced in this way had a threshold voltage of 4.8 V. It was found that according the present invention, an electrode having superior characteristics could be obtained by forming an n-type electrode on an N-terminated surface of a GaN layer even if it is not the substrate. This example also shows the effect of forming the n-type electrode on the N-terminated surface where N atom comprises at least 60% of the terminator atoms present on the surface.

Alternatively, the polarity can also be controlled by employing HVPE, MOCVD or MEB to control nitriding of the substrate, annealing of the buffer layer and the like. In this example, as discussed above, the specific contact resistance of the n-type electrode formed on the N-terminated surface can be reduced.

FIG. 25 shows a preferable impurity concentration in the substrate used in the present invention. According to the present invention, the preferable impurity concentration is within the first region (at least $1 \times 10^{17}$ cm$^{-3}$ and at most $1 \times 10^{21}$ cm$^{-3}$). This range can provide a low specific contact resistance, a low threshold voltage and a low threshold current density. The second region represents a more preferable range of impurity concentration (at least $1 \times 10^{17}$ cm$^{-3}$ and at most $1 \times 10^{19}$ cm$^{-3}$). The reason why the second region is more preferable than the first region can be understood by referring to the relation between the impurity concentration and the threshold current density shown in FIG. 8. Referring to FIG. 8, although the threshold current density actually decreases when the impurity concentration is in the first region, i.e., $1 \times 10^{21}$ cm$^{-3}$ or less, the threshold current density further decreases when the impurity concentration is in the second range, i.e., $1 \times 10^{19}$ cm$^{-3}$ or less. The first region is divided into two impurity concentration ranges, a region I and a region II shown in FIG. 25. The impurity concentration in the region I is at least $3\times10^{18}$ cm$^{-3}$ and at most $1\times10^{21}$ cm$^{-3}$. The impurity concentration in the region II is at least $1\times10^{17}$ cm$^{-3}$ and at most $3\times10^{18}$ cm$^{-3}$. According to the present invention, a nitride semiconductor substrate is preferably composed of a first portion having an average impurity concentration in the region I and a second portion having an average impurity concentration in the region II. The first portion preferably forms an N-terminated surface and an n-type electrode is formed on the N-terminated surface of the first portion. Further, epitaxial layers for a semiconductor device such as a light-emitting device are preferably formed on the second portion. The reason for and significance of dividing the nitride substrate into the first and second portions having different impurity concentrations are discussed below.

Referring to the relation between the impurity concentration and the specific contact resistance shown in FIG. 10, the specific contact resistance is $1\times10^{-5}$ $\Omega\cdot$cm$^2$ when the impurity concentration is $1\times10^{17}$ cm$^{-3}$, and the specific contact resistance decreases to approximately $5\times10^{-7}$ to $1\times10^{-6}$ $\Omega\cdot$cm$^2$ when the impurity concentration is $3\times10^{18}$ cm$^{-3}$ or higher. Referring to the relation between the impurity concentration and the threshold voltage shown in FIG. 7, the threshold voltage does not change when the impurity concentration is $1\times10^{17}$ cm$^{-3}$ or higher, and the threshold voltage stays almost at the same level whether the impurity concentration is $1\times10^{17}$ cm$^{-3}$ or $3\times10^{18}$ cm$^{-3}$. In other words, it is considered that the effect of decrease in the specific contact resistance as shown in FIG. 10 can bring no benefit to the threshold voltage as shown in FIG. 7. In order to cause impurities to form an intermediate product between the n-type electrode and the nitride semiconductor substrate (N-terminated surface) and to achieve a low specific contact resistance, the impurity concentration is preferably set at $3\times10^{18}$ cm$^{-3}$ or higher (see FIG. 10). On the other hand, if impurities are added at a higher concentration ($3\times10^{18}$ cm$^{-3}$ or more) to the entire nitride semiconductor substrate, the electric resistance can increase due to deteriorated crystallinity, so that the effect of the low contact resistance as shown in FIG. 10 can bring no benefit to a low threshold voltage. Further, it is understood from the relation between the impurity concentration and the threshold current density shown in FIG. 8 that if impurities are added at a concentration of at least $3\times10^{18}$ cm$^{-3}$, the threshold current density is approximately 1 kA/cm$^2$ as far as the impurity concentration is $5\times10^{18}$ cm$^{-3}$ or less, and that the threshold current value begins to increase when the impurity concentration is $1\times10^{19}$ cm$^{-3}$ or more (this relation is similar to the relation between the impurity concentration and the surface roughness shown in FIG. 9). The above shows that if the impurity concentration is increased, the specific contact resistance can decrease while the threshold current can increase on the contrary.

The inventors have found that this dilemma can be solved by using a nitride semiconductor substrate composed of at least two layers respectively having different impurity concentrations. Specifically, in the present invention, an n-type nitride substrate is composed of a first layer having an N-terminated surface to be in contact with an n-type electrode and a second layer on which a device structure is to be fabricated, and the average impurity concentration of the second layer is lower than that of the first layer. The average impurity concentration of the first layer may be at least $3\times10^{18}$ cm$^{-3}$. Although there is no particular limitation on the range of the average impurity concentration of the first layer, the average impurity concentration of the first layer is preferably from $3\times10^{18}$ cm$^{-3}$ to $1\times10^{21}$ cm$^{-3}$, and more preferably from $3\times10^{18}$ cm$^{-3}$ to $1\times10^{19}$ cm$^{-3}$, considering the result shown in FIG. 8. The average impurity concentration of the second layer may be $3\times10^{18}$ cm$^{-3}$ or less. There is also no particular limitation on the range of the average impurity concentration of the second layer. Considering the results shown in FIGS. 7 and 8, the average impurity concentration of the second layer is preferably from $1\times10^{17}$ cm$^{-3}$ to $3\times10^{18}$ cm$^{-3}$. The average impurity concentration is herein defined as a value calculated by dividing the total concentration of impurities added to a certain layer by the thickness of that layer. Preferably, the second layer is the portion other than the first layer in the nitride semiconductor substrate.

The thickness of the first layer may be at least 0.05 $\mu$m and at most 50 $\mu$m, and preferably at least 0.05 $\mu$m and at most 10 $\mu$m. If the thickness of the first layer is smaller than 0.05 $\mu$m, added impurities may not sufficiently form an intermediate product, so that the specific contact resistance could be increased. If the first layer has a thickness greater than 50 $\mu$m, added impurities can cause greater roughness (see FIG. 9), which could increase loss in an optical waveguide and lead to an increase in the threshold current density (see FIG. 8). The value of the threshold current density can be reduced smaller than the values shown in FIG. 8 by setting the thickness of the first layer to 50 $\mu$m or less and preferably to 10 $\mu$m or less.

In the present invention, Si, O, Cl, S, Se or Te can preferably be used as n-type impurities. In particular, using Si, O or Cl, the n-type nitride semiconductor substrate can easily be produced. Some types of the impurities mentioned above may be added simultaneously to the nitride semiconductor substrate. The average concentration of all the added impurities may be at least $3\times10^{18}$ cm$^{-3}$ and at most $1\times10^{21}$ cm$^{-3}$, and preferably at least $3\times10^{18}$ cm$^{-3}$ and at most $1\times10^{19}$ cm$^{-3}$ in the first layer and at least $1\times10^{17}$ cm$^{-3}$ and at most $3\times10^{18}$ cm$^{-3}$ in the second layer. The present invention is hereinafter described in more detail in conjunction with the following examples.

EXAMPLE 9

Figure 26:
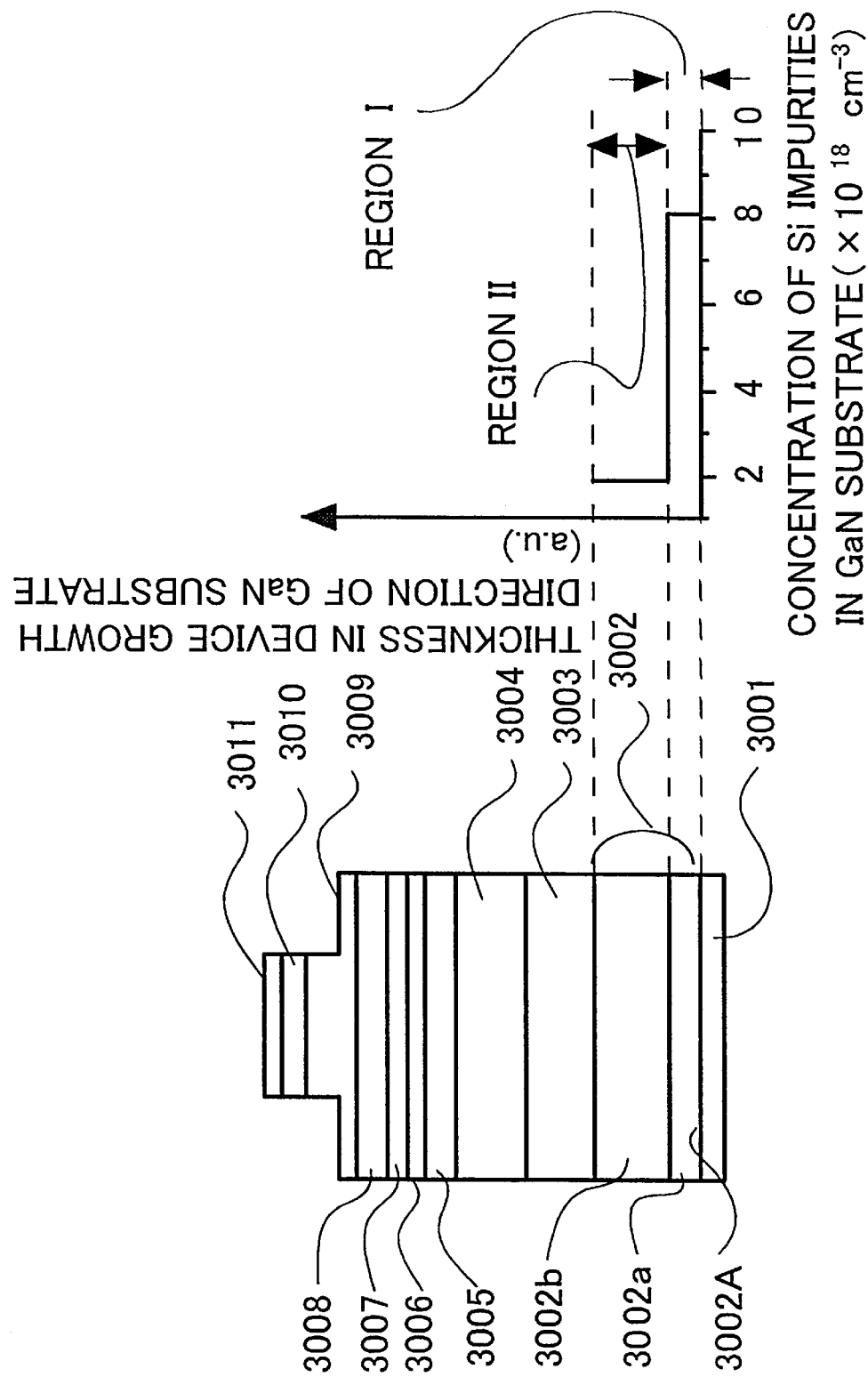
FIG. 26 is a schematic cross section of a nitride semiconductor light-emitting device in example 9.

Referring to FIG. 26, a nitride semiconductor light-emitting device (laser diode) in this example is constituted of an n-type electrode 3001, a nitride semiconductor substrate (e.g. GaN substrate) 3002, an n-type GaN layer 3003, an n-type Al$_{0.1}$Ga$_{0.9}$N cladding layer 3004, an n-type GaN light guiding layer 3005, a light-emitting layer 3006 of multiple quantum wells, a p-type Al$_{0.2}$Ga$_{0.8}$N carrier blocking layer 3007, a p-type GaN light guiding layer 3008, a p-type Al$_{0.1}$Ga$_{0.9}$N cladding layer 3009, a p-type GaN contact layer 3010, and a p-type electrode 3011. Substrate 3002 is constituted of a highly-doped GaN layer 3002a (wherein the range of the average impurity concentration is in region I shown in FIG. 25), and a low-doped GaN layer 3002b (wherein the range of the average impurity concentration is in region II shown in FIG. 25). N-type electrode 3001 is formed on an N-terminated surface 3002A of substrate 3002. The average impurity concentration is defined by dividing the total concentration of impurities added to the layer by the thickness.

The important features of this example are in that respective average impurity concentrations of highly-doped GaN layer 3002a and low-doped GaN layer 3002b constituting nitride semiconductor substrate 3002 are in the regions I and II respectively shown in FIG. 25, the n-type electrode is in contact with N-terminated surface 3002A of highly-doped GaN layer 3002a, and the light-emitting device structure is in contact with low-doped GaN layer 3002b.

Highly-doped GaN layer 3002a having an average impurity concentration of at least $3\times10^{18}$ cm$^{-3}$ can sufficiently form an intermediate product. Consequently, the specific contact resistance between highly-doped GaN layer 3002a and n-type electrode 3001 decreases. The arrangement of the light-emitting device structure on low-doped GaN layer 3002b having an average impurity concentration of at most $3\times10^{18}$ cm$^{-3}$ can achieve lower threshold current density and lower threshold voltage.

The laser device in this example provides a lower threshold current density (0.8 kA/cm$^2$) and a lower threshold voltage (4.4 V) than those of examples 1 to 8 (threshold current density 1.2 kA/cm$^2$ and threshold voltage 5 V for example).

EXAMPLE 10

Figure 27:
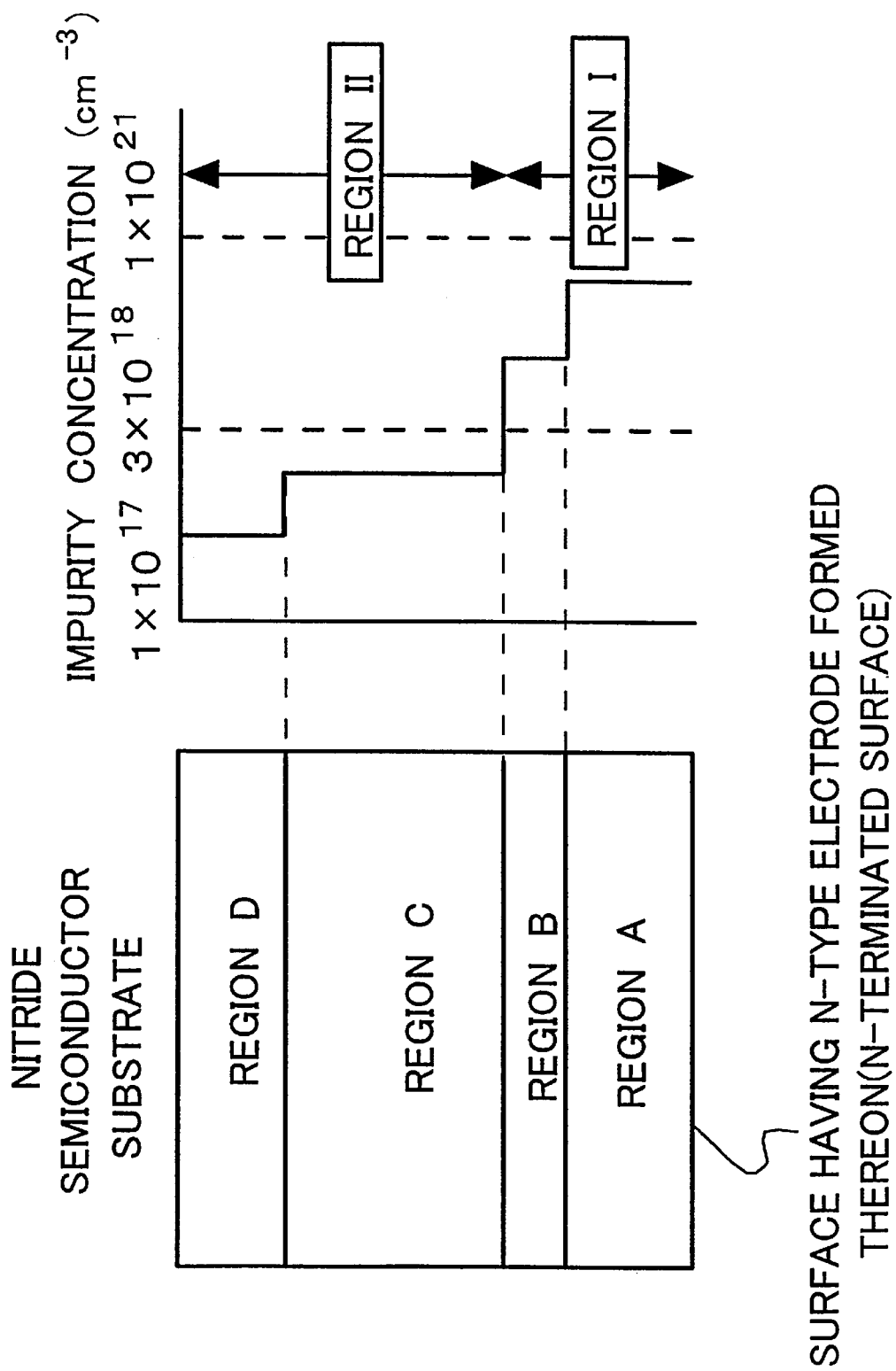
FIG. 27 shows an impurity concentration profile of a nitride semiconductor substrate used in example 10.

This example is similar to example 9 except that the nitride semiconductor substrate is composed of four regions respectively having different impurity concentrations. FIG. 27 shows the impurity concentration profile of the nitride semiconductor substrate. The four regions are referred to as region A, region B, region C and region D in the order from the region where an n-type electrode is formed. The n-type electrode (not shown) is in contact with region A. The n-type electrode is in contact with an N-terminated surface of region A. Respective average impurity concentrations of region A and region B are in region I shown in FIG. 25 and respective average impurity concentrations of region C and region D are in region II in FIG. 25.

A light-emitting device employing this nitride semiconductor substrate provides similar effects to those of example 9.

EXAMPLE 11

Figure 28:
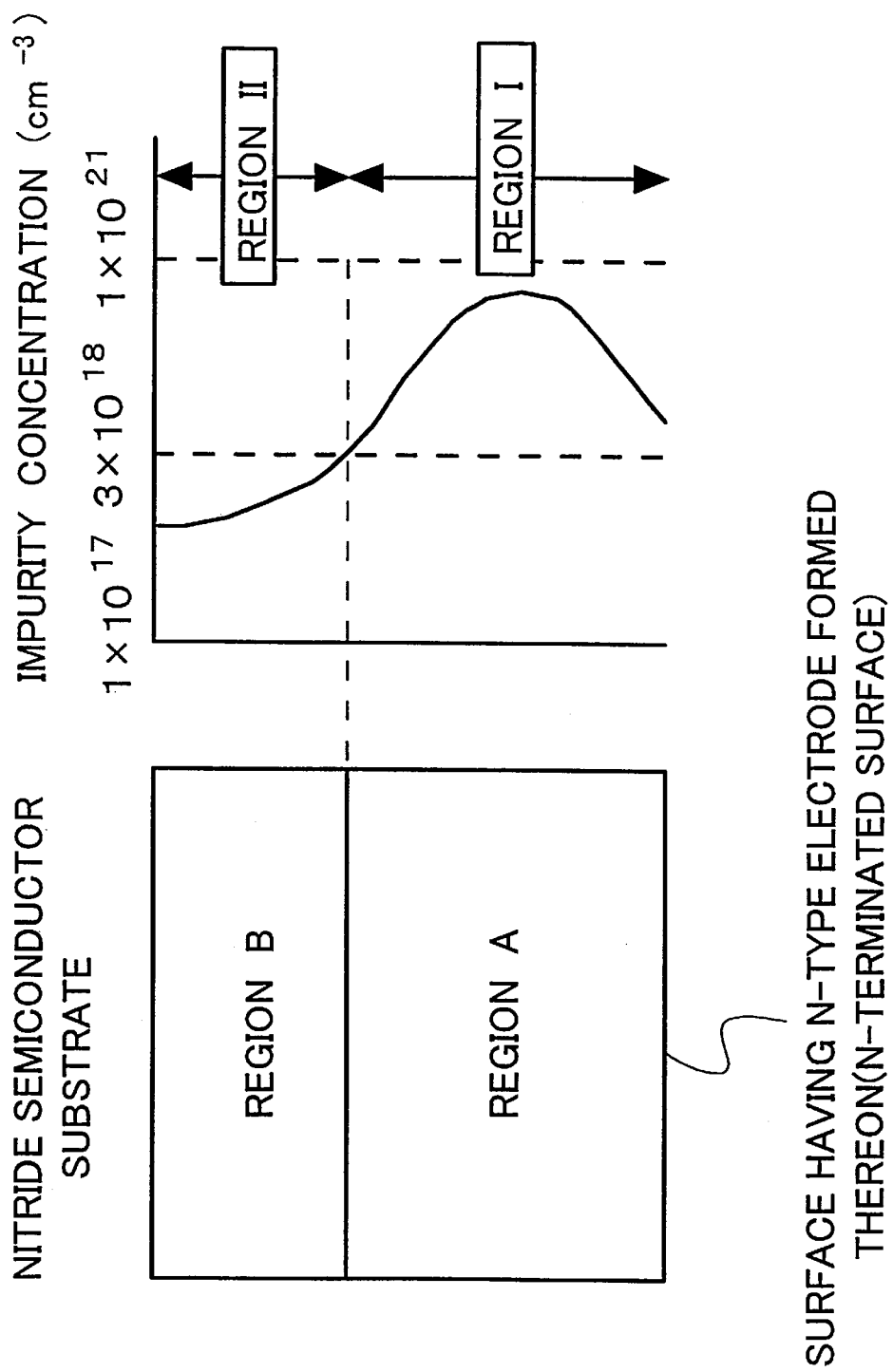
FIG. 28 shows an impurity concentration profile of a nitride semiconductor substrate used in example 11.

This example is similar to example 9 except that the nitride semiconductor substrate used herein has an impurity concentration that continuously varies in the direction of the thickness. FIG. 28 shows the impurity concentration profile in which the concentration continuously changes in the nitride semiconductor substrate. The profile of the continuously changing impurity concentration can be divided into two regions. These regions are called region A and region B in the order from the region where an n-type electrode is formed. The n-type electrode is formed to be in contact with region A. The n-type electrode is in contact with an N-terminated surface of region A. The average impurity concentration of region A is in region I in FIG. 25, and the average impurity concentration of region B is in region II in FIG. 25.

A light-emitting device employing this nitride semiconductor substrate provides similar effects to those of example 9.

EXAMPLE 12

This example is similar to example 9 except that the nitride semiconductor substrate is composed of five regions respectively having different impurity concentrations as shown in FIG. 29. FIG. 29 shows the impurity concentration profile in the employed nitride semiconductor substrate. The regions are referred to as region A, region B, region C, region D and region E in the order from the region where an n-type electrode is formed. The n-type electrode (not shown) is fabricated to be in contact with an N-terminated surface of region A. Respective impurity concentrations of region A, region B and region D are in region I in FIG. 25. Respective impurity concentrations of region C and region E are in region II in FIG. 25.

The total film thickness of region A and region B is 50 $\mu$m. Respective average impurity concentrations of region A and region B are in region I in FIG. 25. Accordingly, the combination of region A and region B provides an effect of reducing the specific contact resistance. On the other hand, the combination of region C (thickness 30 $\mu$m, impurity concentration $2\times10^{18}$ cm$^{-3}$), region D (thickness 20 $\mu$m, impurity concentration $5\times10^{18}$ cm$^{-3}$), and region E (thickness 60 $\mu$m, impurity concentration $1\times10^{18}$ cm$^{-3}$) has an average impurity concentration which is estimated at $2\times10^{18}$ cm$^{-3}$ from respective impurity concentrations of those regions and the total thickness of them. This concentration is in region II in FIG. 25. Accordingly, the combination of region C, region D and region E provides an effect of reducing the threshold voltage and the threshold current density.

A light-emitting device employing this nitride semiconductor substrate achieves similar effects to those of example 9.

As discussed above, in the nitride semiconductor substrate, respective impurity concentrations of the first region being in contact with the n-type electrode and the second region being in contact with the device structure may vary in each region. As far as the average impurity concentration of the first region is at least $3\times10^{18}$ cm$^{-3}$, the first region may have any portion having an impurity concentration lower than $3\times10^{18}$ cm$^{-3}$. In addition, as far as the average impurity concentration of the second region is $3\times10^{18}$ cm$^{-3}$ or less, the second region may have any portion having an impurity concentration higher than $3\times10^{18}$ cm$^{-3}$. If any region composed of a plurality of portions respectively having different impurity concentrations has a total film thickness of 50 $\mu$m or less and has its average impurity concentration in region I shown in FIG. 25, such region can effectively reduce the specific contact resistance. Further, if a region composed of a plurality of portions respectively having different impurity concentrations has its average impurity concentration in region II shown in FIG. 25, such region can effectively reduce the threshold voltage and threshold current density.

Regarding examples 1 to 12 described above, only the semiconductor laser diode device is referred to. However, the present invention is also applicable to light-emitting diode devices. The light-emitting diode devices according to the present invention can effectively provide lower specific contact resistance, lower operating voltage, prevention of non-uniformity in the emitted color by decreasing surface roughness, or improvement in the intensity of emitted light.

As heretofore discussed, according to the present invention, nitride semiconductor devices, especially GaN compound semiconductor light-emitting devices that have a low threshold voltage and a low threshold current density as well as a long life can be produced with a good yield.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A III-N compound semiconductor device comprising:
   a III-N compound semiconductor substrate;
   a plurality of III-N compound semiconductor layers formed on said semiconductor substrate; and
   an n-type electrode and a p-type electrode for applying voltage to said plurality of semiconductor layers formed on said semiconductor substrate, wherein
   said semiconductor substrate is of n-type, and
   said n-type electrode is formed on a nitrogen-terminated surface of said semiconductor substrate.

2. The semiconductor device according to claim 1, wherein
   said III-N compound semiconductor is GaN compound semiconductor.

3. The semiconductor device according to claim 1, wherein concentration of n-type impurities in said semiconductor substrate ranges from $1\times10^{17}$ cm$^{-3}$ to $1\times10^{21}$ cm$^{-3}$.

4. The semiconductor device according to claim 3, wherein said concentration of n-type impurities is constant in the direction of thickness of said semiconductor substrate.

5. The semiconductor device according to claim 3, wherein said concentration of n-type impurities varies in the direction of thickness of said semiconductor substrate.

6. The semiconductor device according to claim 1, wherein concentration of n-type impurities in said semiconductor substrate ranges from $1\times10^{17}$ cm$^{-3}$ to $1\times10^{19}$ cm$^{-3}$.

7. The semiconductor device according to claim 6, wherein said concentration of n-type impurities is constant in the direction of thickness of said semiconductor substrate.

8. The semiconductor device according to claim 6, wherein said concentration of n-type impurities varies in the direction of thickness of said semiconductor substrate.

9. The semiconductor device according to claim 1, wherein concentration of n-type impurities in said semiconductor substrate varies in the direction of thickness of said semiconductor substrate, and said semiconductor substrate includes at least a first portion forming said nitrogen-terminated surface and having a first concentration of n-type impurities and a second portion having a second concentration of n-type impurities lower than said first concentration of n-type impurities.

10. The semiconductor device according to claim 9, wherein said first concentration of n-type impurities is at least $3\times10^{18}$ cm$^{-3}$.

11. The semiconductor device according to claim 10, wherein said first portion has a thickness from 0.05 µm to 50 µm.

12. The semiconductor device according to claim 9, wherein said plurality of semiconductor layers are formed on said second portion.

13. The semiconductor device according to claim 12, wherein said first portion has a thickness from 0.05 µm to 50 µm.

14. The semiconductor device according to claim 9, wherein said first concentration of n-type impurities in said first portion is at least $3\times10^{18}$ cm$^{-3}$, and said plurality of semiconductor layers are formed on said second portion.

15. The semiconductor device according to claim 14, wherein said first portion has a thickness from 0.05 µm to 50 µm.

16. The semiconductor device according to claim 1, wherein said semiconductor device is a light-emitting device.

17. A III-N compound semiconductor device, comprising:

a III-N compound semiconductor substrate;

a plurality of III-N compound semiconductor layers formed on said semiconductor substrate; and an n-type electrode and a p-type electrode for applying voltage to said plurality of semiconductor layers formed on said semiconductor substrate, wherein said semiconductor substrate is of p-type, uppermost layer of said plurality of semiconductor layers has a nitrogen-terminated surface, and said n-type electrode is formed on said nitrogen-terminated surface.

18. The semiconductor device according to claim 17, wherein said III-N compound semiconductor is GaN compound semiconductor.

19. The semiconductor device according to claim 18, wherein said p-type electrode is formed on a Ga-terminated surface of said semiconductor substrate.

20. The semiconductor device according to claim 17, wherein said semiconductor device is a light-emitting device.

21. A III-N compound semiconductor device, comprising:

a III-N compound semiconductor substrate;

a plurality of III-N compound semiconductor layers formed on said semiconductor substrate; and an n-type electrode and a p-type electrode for applying voltage to said plurality of semiconductor layers formed on said semiconductor substrate, wherein said semiconductor substrate is of n-type, said n-type electrode is formed on a nitrogen-terminated surface of said semiconductor substrate, concentration of n-type impurities in said semiconductor substrate varies in the direction of thickness of said semiconductor substrate, said semiconductor substrate is composed of a first portion forming said nitrogen-terminated surface and having a first average concentration of n-type impurities and a second portion having a second average concentration of n-type impurities lower than said first average concentration of n-type impurities, said first average concentration of n-type impurities is at least $3\times10^{18}$ cm$^{-3}$, and said second average concentration of n-type impurities is at most $3\times10^{18}$ cm$^{-3}$, and said plurality of semiconductor layers are formed on said second portion.

22. The semiconductor device according to claim 21, wherein said first average concentration of n-type impurities ranges from $3\times10^{18}$ cm$^{-3}$ to $1\times10^{21}$ cm$^{-3}$ and said second average concentration of n-type impurities ranges from $1\times10^{17}$ cm$^{-3}$ to $3\times10^{18}$ cm$^{-3}$.

23. The semiconductor device according to claim 22, wherein said first average concentration of n-type impurities ranges from $3\times10^{18}$ cm$^{-3}$ to $1\times10^{19}$ cm$^{-3}$.

24. The semiconductor device according to claim 21, wherein said III-N compound semiconductor is GaN compound semiconductor.

25. The semiconductor device according to claim 21, wherein said semiconductor device is a light-emitting device.

* * * * *